(12) United States Patent
Evans et al.

(10) Patent No.: US 10,957,512 B1
(45) Date of Patent: Mar. 23, 2021

(54) METHOD AND DEVICE FOR A CARRIER PROXIMITY MASK

(71) Applicant: APPLIED Materials, Inc., Santa Clara, CA (US)

(72) Inventors: Morgan Evans, Manchester, MA (US); Charles T. Carlson, Cedar Park, TX (US); Rutger Meyer Timmerman Thijssen, Sunnyvale, CA (US); Ross Bandy, Milton, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/582,249

(22) Filed: Sep. 25, 2019

(51) Int. Cl.
*H01J 37/09* (2006.01)
*H01J 37/305* (2006.01)

(52) U.S. Cl.
CPC .......... *H01J 37/09* (2013.01); *H01J 37/3053* (2013.01); *H01J 2237/0451* (2013.01); *H01J 2237/3174* (2013.01)

(58) Field of Classification Search
CPC ......... H01L 2924/0002; H01L 2924/00; H01L 21/02104; H01L 21/02381; H01L 21/0242; H01L 21/02458; H01L 21/0254; H01L 21/02639; H01L 21/02647; H01L 21/2654; H01L 21/26546; H01L 21/2656; H01L 21/3083; H01L 21/31116; H01L 21/31144; H01L 21/67069; H01L 21/67109; H01L 21/823431; H01L 21/823481;
(Continued)

(56) References Cited

U.S. PATENT DOCUMENTS 4,391,651 A * 7/1983 Yoder ................. H01L 21/2654
438/520
5,252,069 A * 10/1993 Lamb ....................... G09B 9/36
2/11
(Continued)

FOREIGN PATENT DOCUMENTS

| CN | 104937135 A | 9/2015 |
| KR | 10-0339186 B1 | 5/2002 |
| WO | 2019139814 A1 | 7/2019 |

OTHER PUBLICATIONS

International Search Report dated Nov. 11, 2020, for the International Patent Application No. PCT/US2020/045252, filed on Aug. 6, 2020, 3 pages.
(Continued)

*Primary Examiner* — David A Vanore
(74) *Attorney, Agent, or Firm* — Kacvinsky Daisak Bluni PLLC

(57) ABSTRACT

A carrier proximity mask and methods of assembling and using the carrier proximity mask may include providing a first carrier body, second carrier body, and set of one or more clamps. The first carrier body may have one or more openings formed as proximity masks to form structures on a first side of a substrate. The first and second carrier bodies may have one or more contact areas to align with one or more contact areas on a first and second sides of the substrate. The set of one or more clamps may clamp the substrate between the first carrier body and the second carrier body at contact areas to suspend work areas of the substrate between the first and second carrier bodies. The openings to define edges to convolve beams to form structures on the substrate.

20 Claims, 12 Drawing Sheets

(58) Field of Classification Search
CPC ............. H01L 27/3211; H01L 29/1075; H01L 33/007; H01L 33/0093; H01L 33/12; H01L 33/16; H01L 33/24; H01L 51/0011; H01L 51/56; C23C 14/042; C23C 14/50; C23C 14/022; C23C 14/24; C23C 14/541; H01J 2237/2001; H01J 2237/304; H01J 2237/31711; H01J 2237/31732; H01J 2237/31737; H01J 2237/31755; H01J 37/3053; H01J 37/3174; H01J 37/32082; H01J 37/32357; H01J 37/3244; H01J 37/32522; H01J 37/32541; H01J 37/32568; H01J 37/32862
USPC ............. 257/14, 617, 655, E21.34, E21.341, 257/E21.343, E29.061; 438/33, 478, 520, 438/522, 692, 715, 732; 430/20, 22, 30, 430/5; 356/399, 400, 401
See application file for complete search history.

(56) References Cited

U.S. PATENT DOCUMENTS

| | | | |
|---|---|---|---|
| 5,571,750 A * | 11/1996 | Watanabe | H01S 5/164 438/33 |
| 6,255,775 B1 * | 7/2001 | Ikuko | H01L 27/3211 313/506 |
| 6,313,905 B1 * | 11/2001 | Brugger | G03F 7/2047 355/53 |
| 7,396,480 B2 * | 7/2008 | Kao | H01L 21/67109 216/58 |
| 8,795,466 B2 | 8/2014 | Barnes et al. | |
| 9,325,007 B2 * | 4/2016 | Kwak | H01M 4/663 |
| 9,337,101 B1 * | 5/2016 | Sung | H01L 21/3083 |
| 2011/0320030 A1 | 12/2011 | Riordon et al. | |
| 2015/0137072 A1 * | 5/2015 | Lee | H01L 33/16 257/14 |
| 2016/0033784 A1 | 2/2016 | Levola et al. | |
| 2016/0035539 A1 * | 2/2016 | Sainiemi | B81C 1/00547 204/298.36 |
| 2019/0211442 A1 * | 7/2019 | Lerner | C23C 14/50 |

OTHER PUBLICATIONS

Written Opinion dated Nov. 11, 2020, for the International Patent Application No. PCT/US2020/045252, filed on Aug. 6, 2020, 7 pages.
International Search Report and Written Opinion dated Nov. 11, 2020 for the International Patent Application No. PCT/US2020/045287, filed on Aug. 6, 2020, 3 pages.
International Search Report and Written Opinion dated Nov. 11, 2020 for the International Patent Application No. PCT/US2020/045287, filed on Aug. 6, 2020, 8 pages.

* cited by examiner

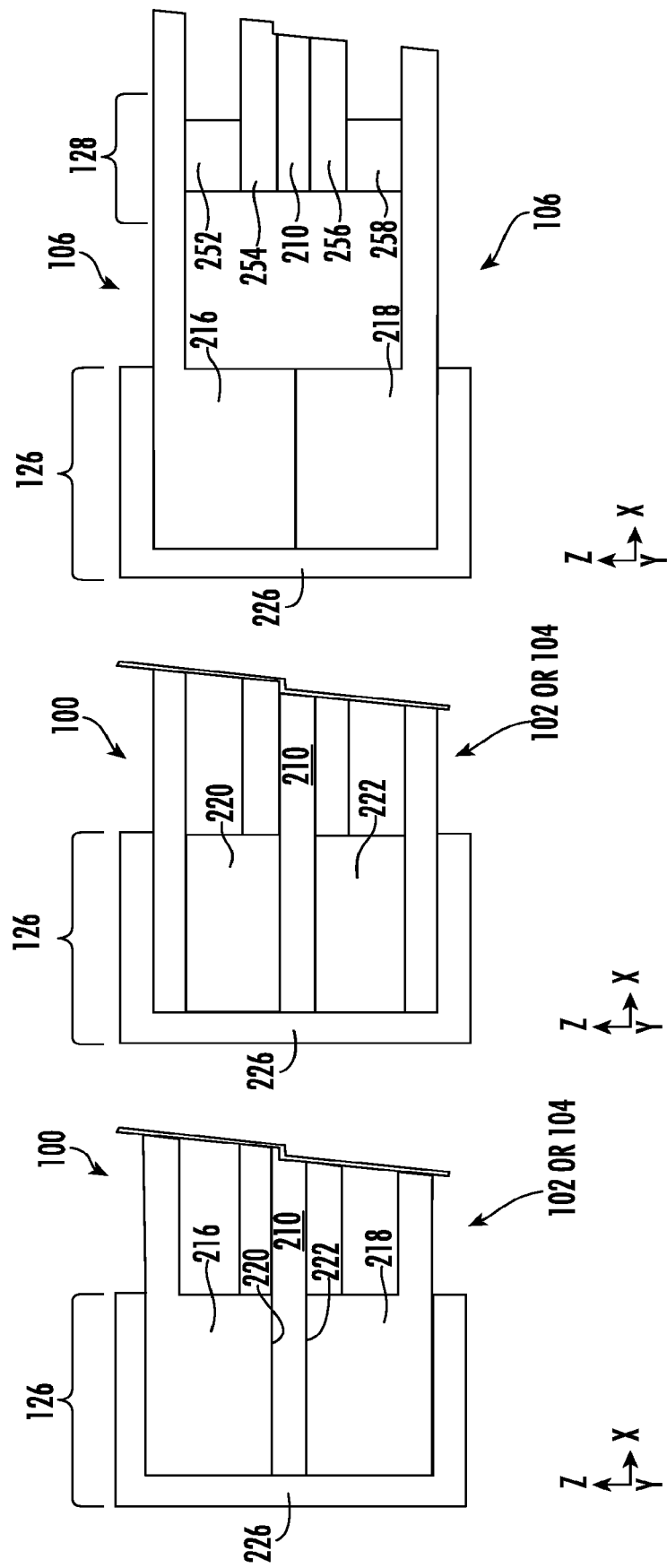

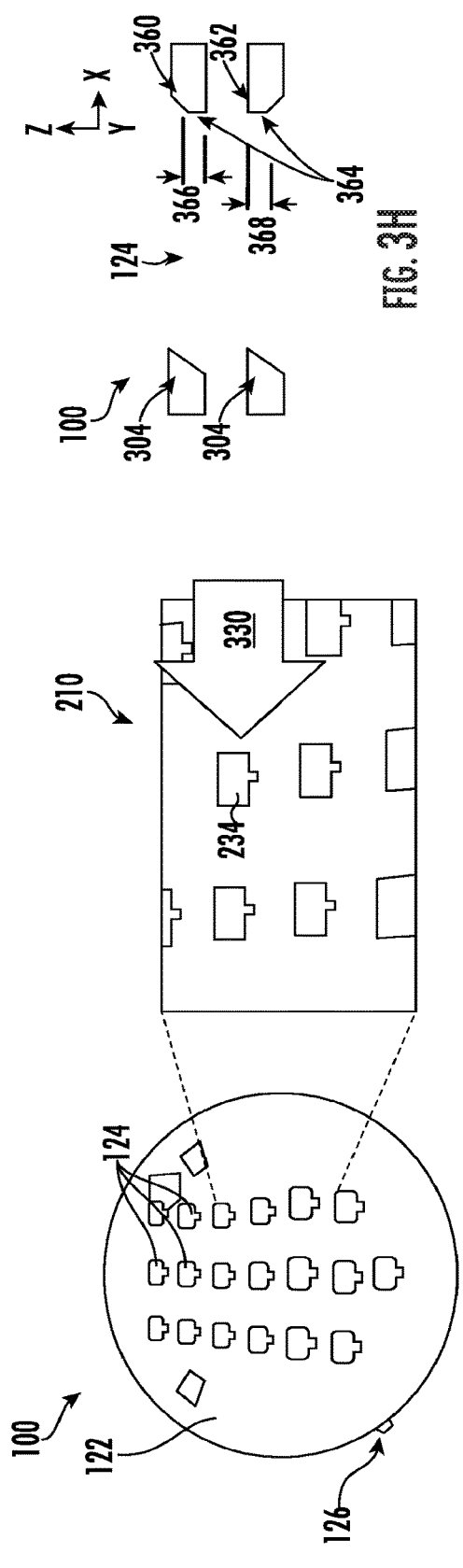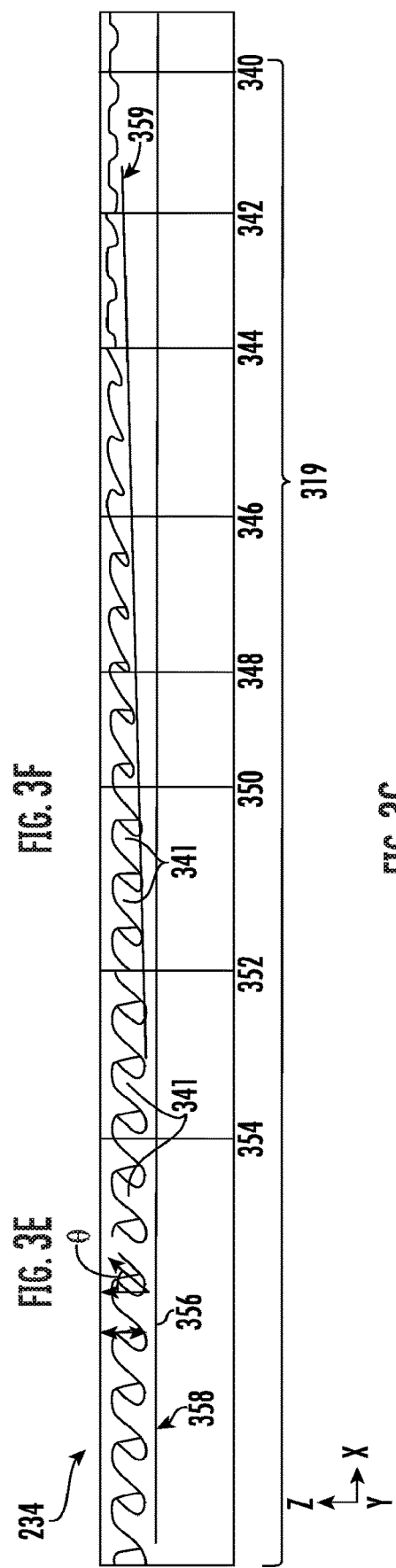

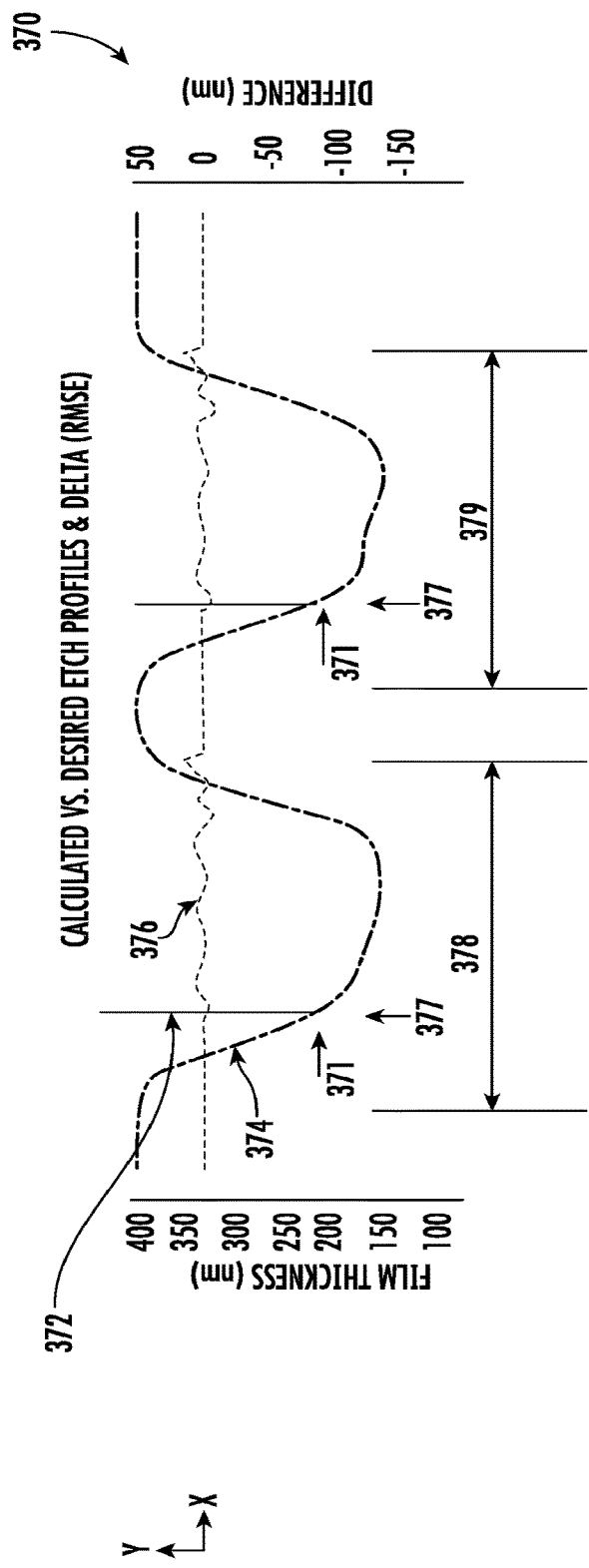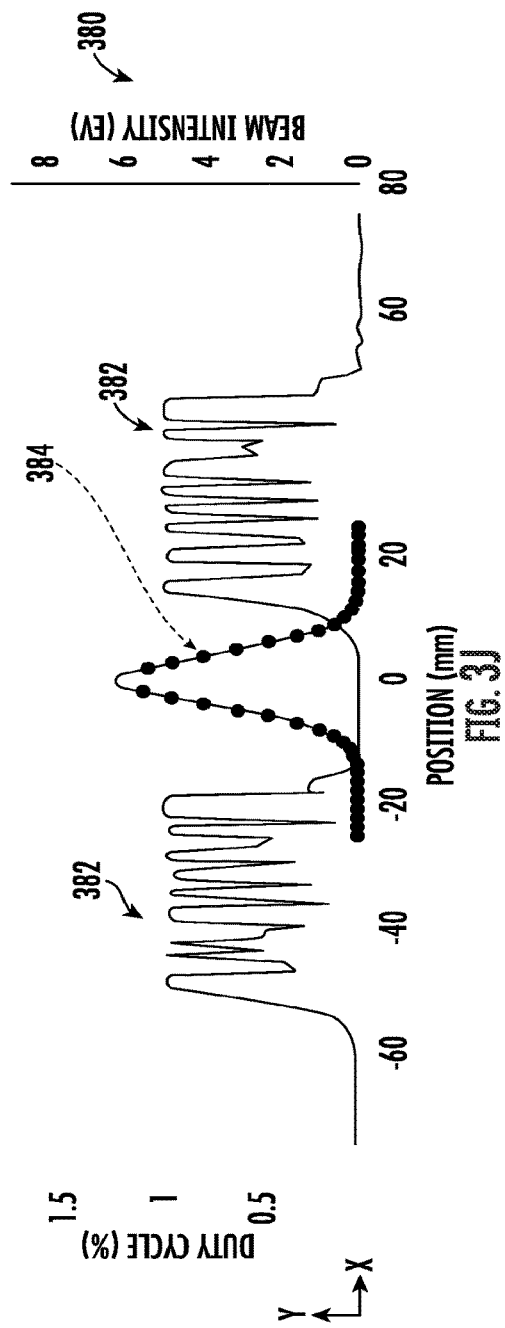

500

PROVIDING A SUBSTRATE
502

PROVIDING A FIRST CARRIER BODY, THE FIRST CARRIER BODY HAVING ONE OR MORE OPENINGS, THE ONE OR MORE OPENINGS FORMED AS PROXIMITY MASKS TO FORM STRUCTURES ON A FIRST SIDE OF A SUBSTRATE, THE FIRST CARRIER BODY HAVING ONE OR MORE CONTACT AREAS, THE CONTACT AREAS TO ALIGN WITH ONE OR MORE CONTACT AREAS ON THE FIRST SIDE OF THE SUBSTRATE
504

PROVIDING A SECOND CARRIER BODY HAVING ONE OR MORE CONTACT AREAS, THE CONTACT AREAS TO ALIGN WITH ONE OR MORE CONTACT AREAS ON A SECOND SIDE OF THE SUBSTRATE
506

CLAMPING A SET OF ONE OR MORE CLAMPS TO THE FIRST CARRIER BODY WITH THE SECOND CARRIER BODY, THE ONE OR MORE CONTACT AREAS OF THE FIRST CARRIER BODY AND THE ONE OR MORE CONTACT AREAS OF THE SECOND CARRIER BODY TO CONTACT OPPOSITE SIDES OF THE SUBSTRATE TO SUSPEND A WORK AREA OF THE FIRST SIDE OF THE SUBSTRATE AND A WORK AREA OF THE SECOND SIDE OF THE SUBSTRATE BETWEEN THE FIRST CARRIER BODY AND THE SECOND CARRIER BODY
508

ALIGNING ONE OR MORE OF THE CONTACT AREAS OF THE FIRST CARRIER BODY WITH EXCLUSION AREAS OF THE FIRST SIDE OF THE SUBSTRATE AND ONE OR MORE OF THE CONTACT AREAS OF THE SECOND CARRIER BODY WITH EXCLUSION AREAS OF THE SECOND SIDE OF THE SUBSTRATE
510

602
PROVIDING A SUBSTRATE IN A CARRIER, THE SUBSTRATE HAVING A WORK AREA OF A FIRST SIDE OF THE SUBSTRATE AND A WORK AREA OF A SECOND SIDE OF THE SUBSTRATE BETWEEN A FIRST CARRIER BODY OF THE CARRIER AND A SECOND CARRIER BODY OF THE CARRIER, THE SUBSTRATE SUSPENDED BETWEEN THE FIRST CARRIER BODY AND THE SECOND CARRIER BODY, THE FIRST CARRIER BODY HAVING ONE OR MORE OPENINGS, THE ONE OR MORE OPENINGS FORMED AS PROXIMITY MASKS TO FORM STRUCTURES ON A FIRST SIDE OF THE SUBSTRATE, THE FIRST CARRIER BODY HAVING ONE OR MORE CONTACT AREAS, THE CONTACT AREAS TO ALIGN WITH ONE OR MORE CONTACT AREAS ON THE FIRST SIDE OF THE SUBSTRATE, THE SECOND CARRIER BODY HAVING ONE OR MORE CONTACT AREAS, THE CONTACT AREAS TO ALIGN WITH ONE OR MORE CONTACT AREAS ON A SECOND SIDE OF THE SUBSTRATE, THE ONE OR MORE CONTACT AREAS OF THE FIRST CARRIER BODY AND THE ONE OR MORE CONTACT AREAS OF THE SECOND CARRIER BODY IN CONTACT WITH OPPOSITE SIDES OF THE SUBSTRATE

604
PROCESSING, WITH A PROCESSING TOOL, THE WORK AREA ON THE FIRST SIDE OF THE SUBSTRATE VIA THE ONE OR MORE OPENINGS TO FORM THE STRUCTURES ON THE FIRST SIDE OF THE SUBSTRATE, WHEREIN AREAS OF THE FIRST CARRIER BODY MASK PORTIONS OF THE WORK AREA ON THE FIRST SIDE OF THE SUBSTRATE

606
FLIPPING THE CARRIER PROXIMITY MASK WITH THE PROCESSING TOOL, TO PROCESS THE SECOND SIDE OF THE SUBSTRATE THROUGH THE ONE OR MORE OPENINGS OF THE SECOND CARRIER BODY

608
PROCESSING A WORK AREA ON THE SECOND SIDE OF THE SUBSTRATE VIA ONE OR MORE OPENINGS IN THE SECOND CARRIER BODY

PROVIDING A SUBSTRATE
702

PROVING A CARRIER, THE CARRIER COMPRISING A FIRST CARRIER BODY COUPLED WITH A SECOND CARRIER BODY, THE SUBSTARTE COUPLED BETWEEN THE FIRST CARRIER BODY AND THE SECOND CARRIER BODY, THE FIRST CARRIER BODY HAVING ONE OR MORE OPENINGS TO EXPOSE WORK AREAS OF THE SUBSTRATE, THE ONE OR MORE OPENINGS HAVING EDGES
704

CONVOLVING A FIRST EDGE OF THE EDGES IN A FIRST OPENING WITH A BEAM FROM A PROCESSING TOOL TO CREATE A CONVOLVED BEAM, THE CONVOLVED BEAM TO ETCH A WORK AREA OF THE SUBSTRATE EXPOSED BY THE FIRST OPENING TO CREATE A VARIABLE ETCH DEPTH PROFILE IN THE SUBSTRATE PROXIMATE TO THE FIRST EDGE
706

FIG. 7

METHOD AND DEVICE FOR A CARRIER PROXIMITY MASK

FIELD

The present embodiments relate to substrate processing of device structures, and more particularly, to processing structures on a substrate with a carrier proximity mask.

BACKGROUND

Substrate devices require small dimensions and the ability to build device structures with such small dimensions is challenging. The synthesis of three-dimensional structures, such as gratings, light wave guides, fin type field effect transistors (finFET) and/or the like, involves challenging processing issues. One challenge relates to generation of augmented reality (AR) glasses. AR glasses may use gratings to diffract light and light wave guides to intermix digital images with real images through a lens such as a glass lens or a plastic lens.

Processes for generation of AR glasses are similar to the processes for generation of semiconductor structures on wafers. For instance, when processing a structure on a silicon substrate or processing a grating structure on a glass or plastic substrate, existing structures are masked to avoid or minimize damage to the existing structures. With respect to AR glasses, damage to a substrate or a coating can reduce definition and/or introduce distortions in an AR scene.

With respect to these and other considerations, the present disclosure is provided.

BRIEF SUMMARY

In one embodiment, a carrier proximity mask may include a first carrier body, the first carrier body having one or more openings, the one or more openings formed as proximity masks to form structures on a first side of a substrate. The first carrier body may have one or more contact areas and the contact areas may align with one or more contact areas on the first side of the substrate. The carrier proximity mask may include a second carrier body having one or more contact areas and the contact areas may align with one or more contact areas on a second side of the substrate. The carrier proximity mask may further include a set of one or more clamps to clamp the first carrier body with the second carrier body. The one or more contact areas of the first carrier body and the one or more contact areas of the second carrier body may contact opposite sides of the substrate to suspend a work area of the first side of the substrate and a work area of the second side of the substrate between the first carrier body and the second carrier body.

In another embodiment, a method of assembling a carrier proximity mask may involve providing a substrate and providing a first carrier body. The first carrier body may have one or more openings and the one or more openings may be formed as proximity masks to form structures on a first side of a substrate. The first carrier body may have one or more contact areas and the contact areas may align with one or more contact areas on the first side of the substrate. The method may further involve providing a second carrier body having one or more contact areas. The contact areas may align with one or more contact areas on a second side of the substrate.

In a further embodiment, a method for forming a structure may involve providing a substrate in a carrier proximity mask. The substrate may have a work area of a first side of the substrate and a work area of a second side of the substrate between a first carrier body of the carrier proximity mask and a second carrier body of the carrier proximity mask. The substrate may be suspended between the first carrier body and the second carrier body. The first carrier body may have one or more openings and the one or more openings may be formed as proximity masks to form structures on a first side of the substrate. The first carrier body may have one or more contact areas and the contact areas may align with one or more contact areas on the first side of the substrate. The second carrier body may have one or more contact areas and the contact areas may align with one or more contact areas on a second side of the substrate. The one or more contact areas of the first carrier body and the one or more contact areas of the second carrier body may contact opposite sides of the substrate.

The method for forming a structure may further involve processing, with a processing tool, the work area on the first side of the substrate via the one or more openings to form the structures on the first side of the substrate. The areas of the first carrier body may mask portions of the work area on the first side of the substrate.

In a further embodiment, a method for forming a variable etch depth profile in a substrate may involve providing a substrate in a carrier. The carrier may comprise comprising a first carrier body coupled with a second carrier body. The substrate may be coupled between the first carrier body and the second carrier body and the first carrier body may have one or more openings to expose work areas of the substrate. Furthermore, the one or more openings having edges and a beam from a processing tool may convolve with a first edge of the edges in a first opening to create a convolved beam. The convolved beam may etch a work area of the substrate exposed by the first opening to create a variable etch depth profile in the substrate proximate to the first edge.

In a further embodiment, a carrier proximity mask may comprise a first carrier body. The first carrier body may have one or more openings and the one or more openings may form proximity masks to form a variable etch depth profile on a first side of a substrate. A first opening of the one or more openings may have an edge to convolve with an ion beam. The edge may have a shape created to convolve with an ion beam of a defined shape, a frequency, and a current density to approximate a desired diffraction profile with the ion beam. The desired diffraction profile of the ion beam may etch the variable etch depth profile in the first side of the substrate.

The carrier proximity mask may also comprise a second carrier body to couple with the first carrier body on a second side of the substrate to suspend the substrate between the first carrier body and the second carrier body and a set of one or more clamps to clamp the first carrier body with the second carrier body.

In a further embodiment, a method for forming a structure may involve providing a substrate in a carrier proximity mask. The substrate may have work areas on a first side of the substrate and one or more work areas on a second side of the substrate. The substrate may be suspended between a first carrier body of the carrier proximity mask and a second carrier body of the carrier proximity mask and the first carrier body may have openings. Each opening may expose one of the work areas on the first side of the substrate and each opening may have first edge.

The method may further involve scanning, by a processing tool, a beam across the openings and processing, with the processing tool, the work areas on the first side of the substrate via the one or more openings. The processing may involve convolving the edges with the beam from the processing tool to create convolved beams. Each convolved beam may etch one of the work areas of the substrate to create a variable etch depth profile in the substrate proximate to a corresponding one of the edges on the first side of the substrate.

BRIEF DESCRIPTION OF THE DRAWINGS

FIGS. 2B-2C depict a portion of s side cross-sectional view of an embodiment of a carrier proximity mask illustrated in FIG. 2A, according to embodiments of the disclosure;

FIG. 2D depicts a portion of a side cross-sectional view of an embodiment of a carrier proximity mask with exclusion areas for contact between the carrier bodies and the substrate, according to embodiments of the disclosure;

FIGS. 3E-F depicts a plan view of a carrier proximity mask and a portion of a wafer with work areas exposed to a processing tool via openings with edges in the carrier proximity mask to create a variable etch depth profile, according to embodiments of the disclosure;

FIG. 3G depicts a portion of a side cross-sectional view of a wafer at a work area with a variable etch depth profile in the substrate, according to embodiments of the disclosure;

FIG. 3H depicts alternative embodiments of shapes of edges for openings in the carrier proximity mask, according to embodiments of the disclosure;

FIG. 3I depicts an embodiment of a chart illustrating a desired variable etch depth profile, an actual variable etch depth profile, and a delta between the variable etch depth profiles for two adjacent carrier proximity mask openings, according to embodiments of the disclosure;

FIG. 3J depicts an embodiment of a chart illustrating an etching beam profile and a duty cycle to convolve with a square edge of an opening in a carrier proximity mask to create the variable etch depth profile in a wafer, according to embodiments of the disclosure;

FIG. 5 shows an exemplary process flow, according to further embodiments of the disclosure; and FIG. 6 shows another exemplary process flow, according to further embodiments of the disclosure.

FIG. 7 shows another exemplary process flow, according to further embodiments of the disclosure.

DETAILED DESCRIPTION

Figure 1A:
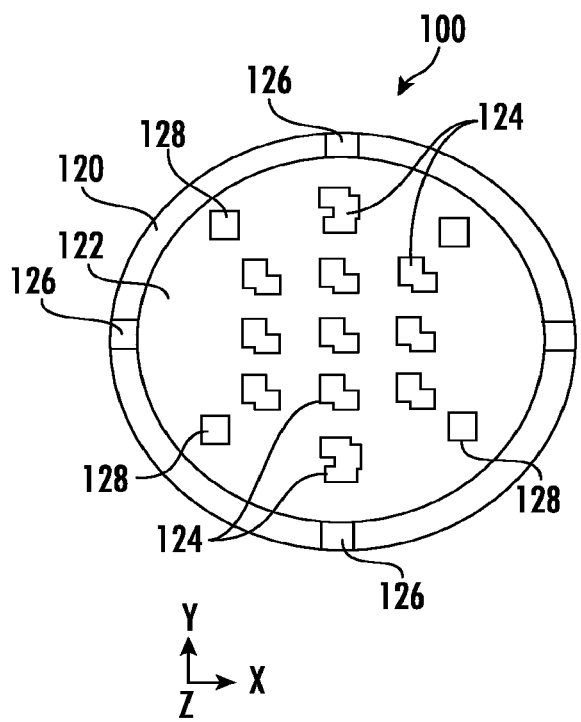
FIG. 1A shows a top view of an embodiment of first carrier body of a carrier proximity mask, in accordance with embodiments of the disclosure.

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The present embodiments provide novel techniques for masking substrate structures to form devices, including three dimensional transistors and/or gratings, formed on a substrate such as glass, plastic, or silicon dioxide. In some embodiments, the devices may be formed in a material layer on the substrate and may be an optically transparent material such as silicon oxide, silicon nitride, glass, titanium dioxide, or other material. As is known, structures, such as gratings and light wave guides, may be arranged to form various types of augmented reality gear and the transistors may be arranged to form various forms of circuitry including processing circuitry and other logic.

Turning now to FIGS. 1A-1D, there are shown in top view, carrier bodies 100, 102, 104, and 106 for a carrier proximity mask, according to embodiments of the disclosure. The carrier proximity mask may couple a substrate between a first carrier body and a second carrier body. The carrier proximity mask may advantageously offer non-contact handling of the substrate by a processing tool including, in some embodiments, non-contact flipping of the substrate to process both a top side and a bottom side of the substrate. The substrate being processed is typically in the form of a wafer and, as a result, the substrate is often referred to as a wafer.

The carrier proximity mask may be manufactured or assembled with a variety of different materials and in a variety of difference ways. The choice of materials for the carrier proximity mask depend on the method of clamping, the process tool to use the carrier proximity mask, and possibly other relevant factors. For instance, the carrier proximity mask is manufactured, built, or assembled with non-conductive materials, semi-conductive materials, and/or conductive materials. Use of conductive materials or semi-conductive materials facilitate electrostatic clamping whereas use of non-conductive materials for the carrier proximity mask may require physical clamping.

The thickness of the first carrier body 100 and the second carrier body 102 or 104 may depend on whether or not the carrier proximity mask will provide structural support to avoid or attenuate deformation of the substrate during processing. In some embodiments, the thickness of the first carrier body 100 and the second carrier body 102 or 104 may depend on the desired height of a face of an edge of an opening perpendicular a plane of the substrate (X-Y plane as illustrated in FIGS. 1A-1D) and formed in the first carrier body 100 and/or the second carrier body 102 or 104. In further embodiments, the thickness of the first carrier body 100 and the second carrier body 102 or 104 may depend on the desired shape of the edge formed in the first carrier body 100 and/or the second carrier body 102 or 104.

The thickness of the first carrier body 100 and the second carrier body 102 or 104 may also depend on the type of material used to build or assemble the first carrier body 100 and the second carrier body 102 or 104. For instance, the first carrier body 100 and the second carrier body 102 or 104 may be composed of titanium, graphite, coated aluminum, ceramic, a combination or alloy of the same, and/or other appropriate materials for the process. The thickness of the first carrier body 100 and the second carrier body 102 or 104 made from titanium may be between, e.g. one half a millimeter and two millimeters. The thickness of the first carrier body 100 and the second carrier body 102 or 104 made from coated aluminum may be between, e.g. one millimeter and two millimeters. And the thickness of the first carrier body 100 and the second carrier body 102 or 104 made from graphite may be between, e.g. two millimeters and five millimeters.

In many embodiments, the carrier proximity tool can interconnect with a processing tool and the substrate to enable the processing tool to process smaller substrate sizes. For example, processing tools may be designed to process particular size wafers such as 300 millimeter (mm) wafers, 200 mm wafers, 100 mm wafers, or 50 mm wafers. The dimension of the wafer refers to the diameter of the substrate. By suspending work areas of a substrate in a 300 mm carrier proximity mask, a 300 mm processing tool can process multiple wafer sizes up to 300 mm such as 50 mm, 100 mm, 200 mm, and 300 mm wafers.

Furthermore, while several of the examples below involve processing tools for etching and deposition, any processing tool benefiting from masks and openings as well as carriers to avoid handling a substrate directly or to provide structural support of the substrate during processing, are considered processing tools in the discussions of embodiments herein and the claims.

FIG. 1A shows the first carrier body 100 in top view, as represented by the X-Y plane of the Cartesian coordinate system also shown. The first carrier body 100 depicts an embodiment of a top carrier body for a substrate (not shown) to contact a first side of the substrate at non-critical, contact areas of the substrate. The first carrier body 100 comprises non-critical, contact areas 126 and 128 to contact corresponding, non-critical, contact areas on the first side of the substrate to suspend and mask critical areas, or work areas, of the first side of substrate.

The number of and location of contact areas 126 and 128 between the first carrier body 100 and the first side of the substrate may depend on the composition of the substrate, the size of the substrate, the stage of processing of the substrate, the product design, and the processing tool. For instance, the substrate may comprise a flexible or non-flexible glass wafer, plastic wafer, silicon wafer, or another substrate wafer. Large, flexible wafers such as 200 mm glass wafers or 300 mm glass wafers may require more structural support than smaller wafers and/or non-flexible wafers to avoid or attenuate detrimental effects associated with, e.g., deformation of the wafers during processing. Depending on the stage of the processing of the substrate, the structures and/or layers formed on the wafer may provide the added structural support.

The first carrier body 100 illustrates multiple types of non-critical contact areas 126 and 128 to support the substrate. Non-critical contact areas may sustain detrimental impacts associated with masking, etching, planarization, annealing, and/or the like with minimal impact or insignificant impact to the resulting structures formed on the substrate.

The contact areas 126 represent areas to couple with the second carrier body 102 or 104 via, e.g., a set of one or more clamps. The contact areas 126 may reside in an exclusionary edge 120 of the substrate, as illustrated in FIG. 1A, assuming the substrate is the same size as the carrier proximity mask. The exclusionary edge 120 of the substrate is illustrated by a ring around the outside of the carrier bodies 100, 102, and 104. For example, if the carrier proximity mask is 300 mm and the substrate is in the form of a 300 mm wafer, then the exclusionary edge 120 of the substrate can be clamped between first carrier body 100 and the second carrier body 102 or 104 at the exclusionary edge 120 of the substrate. On the other hand, if the carrier proximity mask is 300 mm and the substrate comprises a 100 mm wafer, a set of one or more clamps may couple the first carrier body with the second carrier body and contact areas 128 may contact the first side of the substrate on the exclusionary edge of the substrate as illustrated in FIG. 1D and discussed below.

The contact areas 128 represent non-critical, contact areas such as an exclusion area outside of the boundary of the exclusionary edge on the substrate. For example, the glass wafer may comprise multiple eye pieces separated by exclusion areas and surrounded by an exclusionary edge to be removed as one of the final stages of processing. Processing may remove the exclusion areas to separate each of the eye pieces in a wafer. While FIG. 1A illustrates four non-critical contact areas 128, other embodiments may have more or less non-critical contact areas 128.

In some embodiments, one or more of or all the contact areas 120 and 128 on the carrier bodies 100, 102, and 104 may include extensions toward the substrate to suspend the substrate between the first carrier body 100 and a second carrier body such as the second carrier body 102 or the alternative second carrier body 104. In further embodiments, corresponding contact areas on the substrate include one or more layers such as metals, films, soft masks, hard masks, and/or the like to contact the first carrier body 100 on the first side of the substrate and to contact the second carrier body 102 or 104 on the second side of the substrate.

The first carrier body 100 also comprises openings 124 to process a work area on the substrate and as well as hard mask areas 122 to mask structures on the substrate or to mask the substrate. The pattern of openings 124 is process dependent and forms a proximity mask. The openings 124 in the first carrier body 100 allow processing of work areas on the first side of the substrate while the remaining area of the first carrier body 100 blocks processes, acting as a hard mask 122. The openings 124 in the carrier bodies 100 and 102 may include angled edges to accommodate angled beam processing such as angled reactive ion etching (RIE), angled ion beam deposition, angled ion beam implantation, and/or the like.

In some embodiments, the masking provided by the first carrier body 100 provides macroscopic masking and is capable of masking structures separated by, e.g., more than a couple millimeters. For microscopic masking, process tools can apply and etch or otherwise remove hard masks through the openings 124 in the first carrier body 100. When required, process tools can employ techniques such as planarization after removing the substrate from the carrier proximity mask and/or before assembly of the substrate in a different carrier or a different carrier proximity mask for further processing.

Each process step or process tool implemented for processing a substrate can advantageously benefit from use of one or more carrier proximity masks. The carrier proximity masks provide hard masks 122 and openings 124 to advantageously reduce the number of processing steps and costs involved with processing a substrate. For instance, inclusion of a second carrier body without openings such as the second carrier body 104 can advantageously protect structures on the second side of a substrate as well as structures formed via the first side of the substrate by providing a hard mask 122 during physical vapor deposition (PVD) and/or chemical vapor deposition (CVD). Thus, the second carrier body 104 advantageously reduces the number processing steps since a mask does not have to be deposited or applied to the second side of the substrate prior to the PVD or CVD and then removed. Another advantage of the carrier proximity mask is handling of flexible glass substrate wafers without having to add metal to the glass to structurally reinforce the glass for processing.

To further illustrate, inclusion of one or more openings 124 in the second carrier body 102 can advantageously reduce steps involved with, e.g., etching structures in a film on the substrate on the second side of the substrate. For instance, without the carrier proximity mask, resist may be applied to the first side of the substrate. The resist may harden in a pattern based on application of ultraviolet light to the resist to form a mask over portions of the substrate to be protected during etching. Thereafter, the portions of the substrate not protected by the mask are etched to form trenches and the substrate is planarized with a chemical mechanical planarization technique to remove the mask.

The steps from application of the resist, application of the ultraviolet light and planarization may not have to occur if a carrier proximity mask is used, advantageously reducing the number of processing steps on each side of the substrate. The carrier proximity mask also advantageously provides the structural support to flip the substrate in the tool without handling the substrate directly.

Figure 1B:
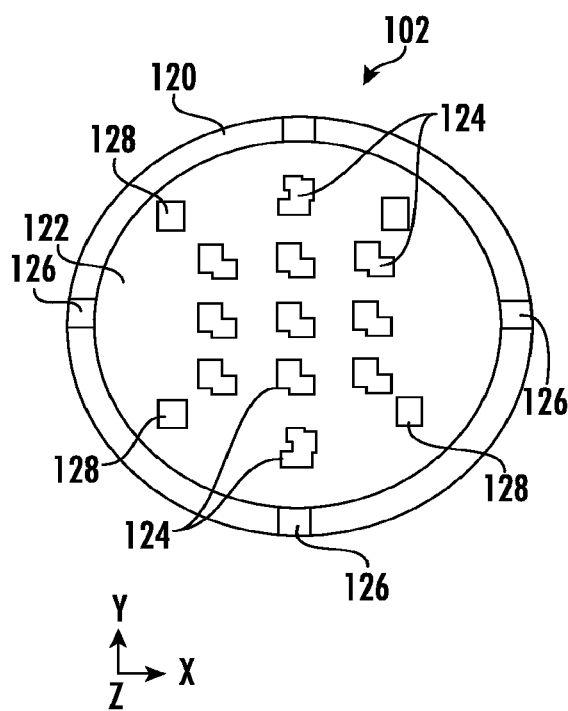
FIG. 1B shows a top view of an embodiment of a second carrier body of the carrier proximity mask shown in FIG. 1A, in accordance with embodiments of the disclosure.

FIG. 1B shows the second carrier body 102 in top view, as represented by the X-Y plane of the Cartesian coordinate system also shown. Note that the specific locations of and numbers of openings and contact areas in the carrier proximity mask are implementation specific. The locations of and numbers of openings and contact areas in the carrier proximity mask depend upon the composition of the substrate, the size of the substrate, the stage of processing of the substrate, the product design, and the processing tool, as well as other considerations.

The second carrier body 102 is an embodiment of a bottom carrier body for a substrate (not shown) to contact a second side (or bottom) of the substrate at non-critical, contact areas of the substrate. Similar to the first carrier body 100, the second carrier body 102 comprises non-critical, contact areas 126 and 128 to contact corresponding, non-critical, contact areas on the second side of the substrate to suspend and mask critical areas, or work areas, of the second side of substrate.

The contact areas 126 represent areas to couple with the second carrier body 102 or 104 via, e.g., a set of one or more clamps. The contact areas 126 may reside in an exclusionary edge 120 of the substrate, as illustrated in FIG. 1B, assuming the substrate is the same size as the carrier proximity mask. The contact areas 126 align vertically along the z-axis with the contact areas 126 on the first carrier body 100 to facilitate clamping with a set of one or more clamps.

The contact areas 128 represent non-critical contact areas such as an exclusion area outside of the boundary of the exclusionary edge of the substrate. The contact areas 128 may vertically align with corresponding contact areas 128 in the first carrier body 100 in some embodiments and may not vertically align with corresponding contact areas 128 in the first carrier body 100 in further embodiments. In embodiments, some of the contact areas 128 in the second carrier body 102 may align with corresponding contact areas 128 in the first carrier body 100 and some of the contact areas 128 in the second carrier body 102 may not align with corresponding contact areas 128 in the first carrier body 100.

In some embodiments, one or more of or all the contact areas 120 and 128 on the carrier bodies 100, 102, and 104 may include extensions toward the substrate to suspend the substrate between the first carrier body 100 and a second carrier body such as the second carrier body 102. In further embodiments, corresponding contact areas on the substrate include one or more layers such as metals, films, soft masks, hard masks, and/or the like to contact the second carrier body 102 on the second side of the substrate.

The second carrier body 102 comprises openings 124 to process structures on the substrate and hard mask areas 122 to mask structures on the substrate or to mask the substrate. The pattern of openings 124 is process dependent and forms a proximity mask. The pattern of openings 124 in the second carrier body 102 may be coordinated with the pattern of openings 124 in the first carrier body 100 to build structures on the substrate and to avoid interference between structures on the first side and the second side of the substrate. For instance, one or more of the openings 124 in the second carrier body 102 may expose work areas on the second side of the substrate adjacent to work areas exposed by the first carrier body 100 on the first side of the substrate to build a structure in the substrate or to build adjacent structures in the substrate.

The openings 124 in the second carrier body 102 allow processing of work areas on the second side of the substrate while the remaining area of the second carrier body 102 blocks processes, acting as a hard mask 122. As with the openings 124 in the first carrier body 100, whether the macroscopic openings will suffice for the process or additional processing is required to form microscopic masks, the second carrier body 102 advantageously reduces the processing steps, reduces the area for processing, reduces the costs of processing, and/or attenuates inadvertent modifications to structures protected by the second carrier body 102 via the hard mask 122.

Figure 1C:
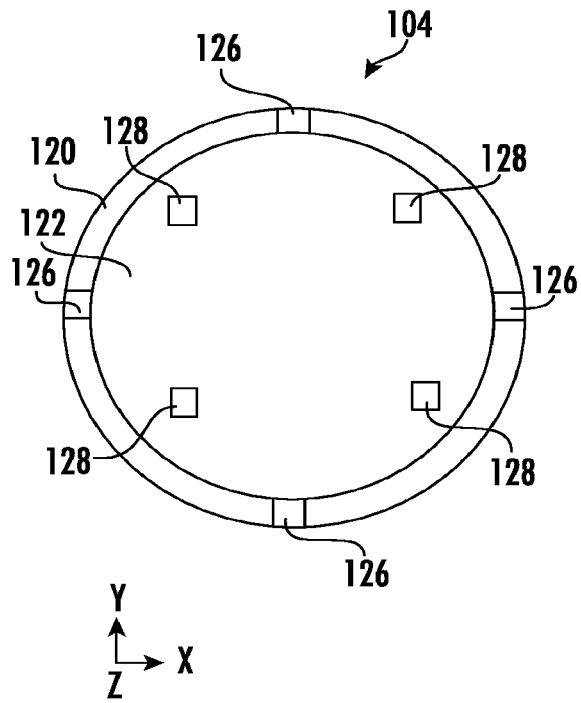
FIG. 1C shows a top view of an alternative embodiment of the second carrier body shown in FIG. 1B, in accordance with embodiments of the disclosure.
Figure 1D:
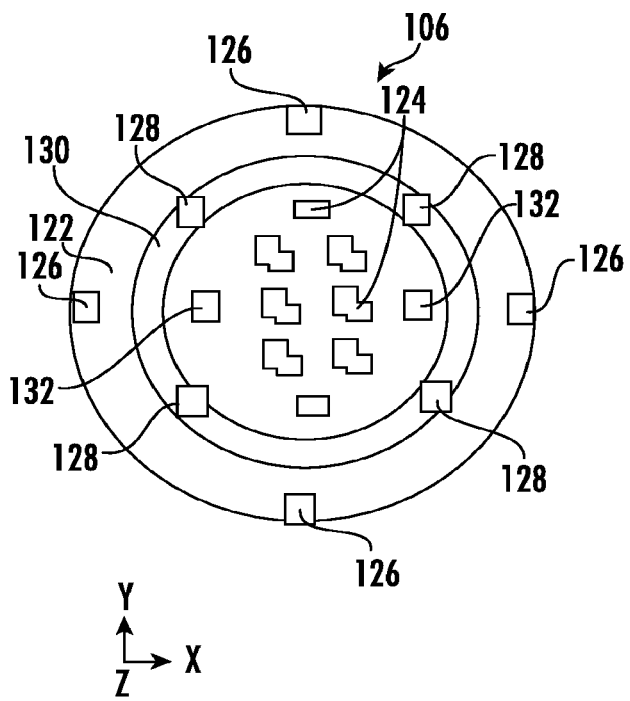
FIG. 1D shows a top view of an alternative embodiment of the second carrier body shown in FIG. 1B, in accordance with embodiments of the disclosure.

FIG. 1C shows the second carrier body 104 in top view, as represented by the X-Y plane of the Cartesian coordinate system also shown. The second carrier body 104 is an embodiment of a carrier body to mask the entire second side of the substrate from a process. For instance, the substrate may be within a carrier proximity mask comprising the first carrier body 100 and the second carrier body 104 clamped via, e.g. electrostatic clamps, at the locations 126 on the first and second carrier bodies 100 and 104. The substrate may be placed in a chamber to electrostatically plate via a sputtering process. During the sputtering process, the second carrier body 104 may protect the second side of the substrate from electrostatic plating. Thus, the second carrier body 104 advantageously reduces the processing steps and costs associated with electrostatically plating the first side of the substrate by reducing or minimizing processing of the first side of the substrate and eliminating processing on the second side of the substrate.

The second carrier body 102 is an embodiment of a bottom carrier body for a substrate (not shown) to contact a second side (or bottom) of the substrate at non-critical, contact areas of the substrate. Similar to the first carrier body 100, the second carrier body 102 comprises non-critical, contact areas 126 and 128 to contact corresponding, non-critical, contact areas on the second side of the substrate to suspend and mask critical areas, or work areas, of the second side of substrate. Furthermore, the non-critical, contact areas 126 of the second carrier body 104 may reside at the exclusionary edge 120 of the substrate.

FIG. 1D shows an embodiment of a first and/or second carrier body 106 designed to adapt a substrate smaller than the processing tool size, for processing by the processing tool. The size of the substrate is represented by the diameter of the exclusionary edge 130 of the substrate. Note that the exclusionary edge 130 of the substrate aligns with the non-critical, contact areas 128 for the purposes of the illustration of the embodiment. The non-critical, contact areas 128 may reside at other locations depending on the size of the substrate. Note also that the non-critical, contact areas 128 and openings 124 of the first and second carrier bodies 106 do not have to align vertically. Furthermore, the first carrier body 106 may comprise openings and the second carrier body 106 may not have openings for a particular embodiment to, e.g., mask the entire second side of the substrate during processing and/or to provide structural support.

The first and/or second carrier body 106 is a top view, as represented by the X-Y plane of the Cartesian coordinate system also shown. Note that the specific locations of and numbers of openings 124 and contact areas 126, 128, and 130 in the carrier proximity mask are implementation specific. The locations of and numbers of openings 124 and contact areas 126, 128, and 130 in the carrier proximity mask depend upon the composition of the substrate, the size of the substrate, the stage of processing of the substrate, the product design, and the processing tool, as well as other considerations. In the present embodiment, the first and/or second carrier body 106 may comprise non-critical, contact areas 130 to contact the substrate to provide additional structural support.

Figure 2A:
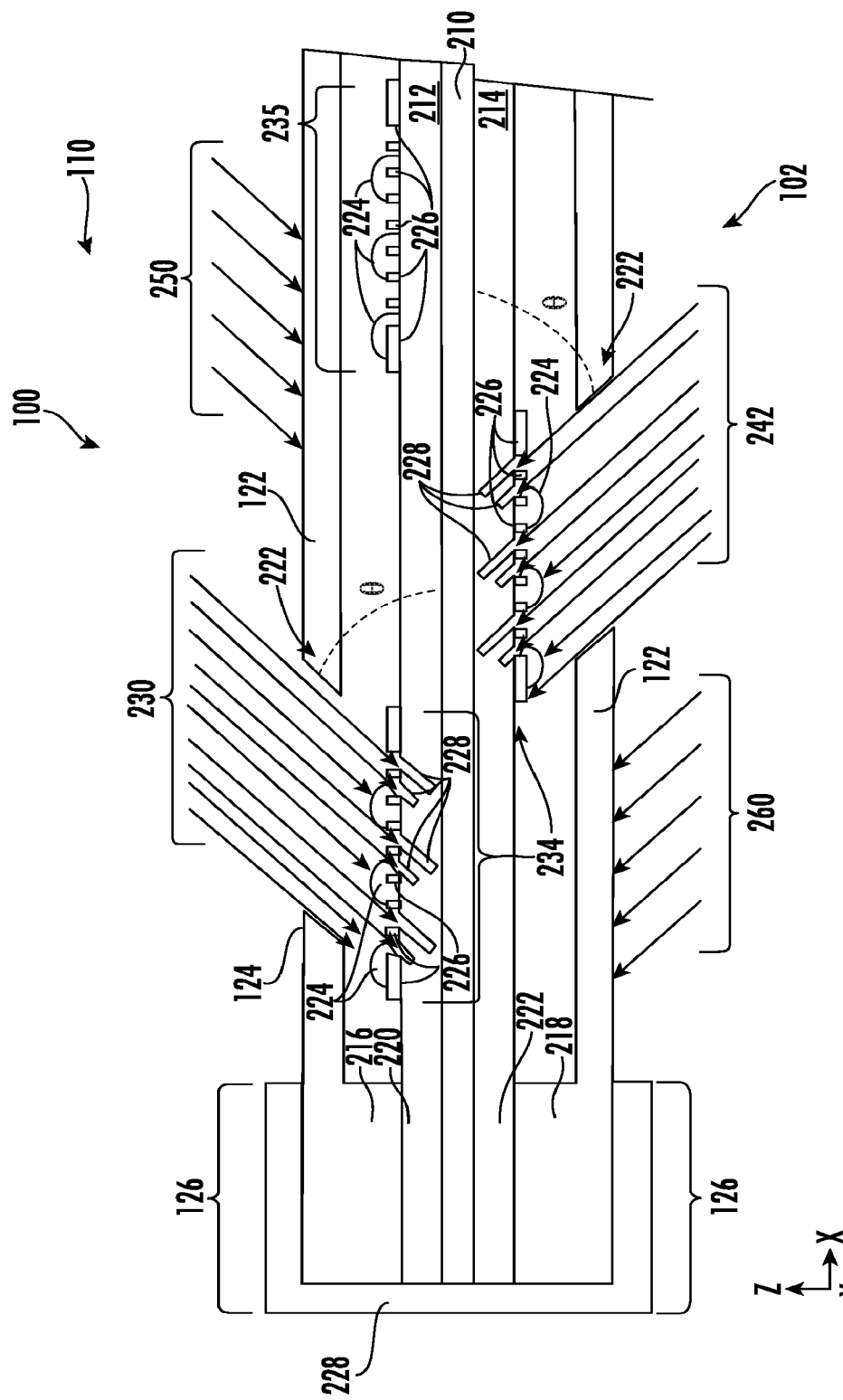
FIG. 2A depicts a portion of a side cross-sectional view of an embodiment of a carrier proximity mask including a substrate affixed between a first (top) carrier body and a second (bottom) carrier body such as the carrier bodies illustrated in FIGS. 1A-1C, according to embodiments of the disclosure.

FIG. 2A shows a vertical cross-section of an embodiment along the z-x plane of a substrate 210 clamped with a clamp 228 at a non-critical contact area 126 of the first carrier body 100, the second carrier body 102, and the substrate 210. The first carrier body 100 include an opening 124 with an angled edge 222 having an angle of declination, theta $\theta$, with respect to a horizontal plane (x-y plane) of the substrate. The first carrier body 100 may also have hard mask areas 122 to mask structures on the substrate such as the structure 235.

In the present embodiment, the first carrier body 100 comprises an extension 216 at a contact area 126 of the first carrier body 100 to contact a film 212 at a contact area 220 on the first (top) side of the substrate 210. The substrate 210 includes a film 222 on the second side of the substrate 210. The second carrier body 102 comprises an extension 218 at a contact area 126 of the second carrier body 102 to contact the film 214 at a contact area 222 on the second (bottom) side of the substrate 210.

Two work areas 234 are exposed to the process tool via the openings 124, one work area 234 on the first side of the substrate 210 via the opening 124 in the first carrier body 100 and one work area 234 on the second side of the substrate via the opening 124 in the second carrier body 102. A third work area 235 on the first side of the substrate 210 is protected from the processing of the other work areas 234 by a hard mask 122 portion of the first carrier body 100.

For illustration purposes, each of the structures in the work areas 234 and 235 are the same. In other embodiments, each structure may be different. The structures include a pattern of hard mask 226 and a pattern of soft mask 224 such as a variable sacrificial layer of resist. The illustration of the soft mask 224 may exaggerate the variations in thickness of the soft mask 224 but, essentially, thicker portions of the soft mask 224 may reduce the depth of etching into the film 212 or 214 behind the soft mask 224.

As an example, a process tool such as an angled reactive ion etching (RIE) tool may process the structures at work areas 234. First, the tool may form angled ion beams 230 through a reactive solution and through the opening 124 in the first carrier body 100 to etch trenches 228 in the film 212 on the first side of the substrate 210. The reactive ion beams 230 directed at the hard mask 226 may not etch the film 212. The reactive ion beams 230 directed at the exposed film 212 may etch the longer trenches 228 in the film 212 and the reactive ion beams 230 directed at the exposed film 212 through the soft mask 224 may etch the shorter trenches 228 in the film 212.

The reactive ion beams 230 can arrive at the film 212 at any angle through the opening 224 of the first carrier body 100 but the inclusion of the angled edge 222 advantageously provides a path along the angled edge 222 of the opening 224 for the arrival of a reactive ion beam at the film 212 in the work area 234 on the first side of the substrate 210. After angled reactive ion etching at the work area 234 on the first side of the substrate 210, the substrate 210 can be flipped by the processing tool or other tool without directly handling the substrate 210 to facilitate processing of the work area 234 on the second side of the substrate 210.

Thereafter, the reactive ion beams 242 may arrive at the film 214 at any angle through the opening 224 in the second carrier body 102 but the inclusion of the angled edge 222 advantageously provides a path along the angled edge 222 of the opening 224 in the second carrier body 102 for the arrival of a reactive ion beam 242 at the film 214 in the work area 234 on the second side of the substrate 210. The reactive ion beams 242 directed at the hard mask 226 may not etch the film 214. The reactive ion beams 242 directed at the exposed film 214 may etch the long trenches 228 in the film 214 and the reactive ion beams 242 directed at the exposed film 214 through the soft mask 224 may etch the short trenches 228 in the film 212.

Note that, in many embodiments, a reactive ion beam may scan 110 across the carrier proximity mask parallel to the plane of the substrate 210 in a particular direction such as along an X-Z plane. The inclusion of the angled edge 222 may be designed to advantageously minimize or attenuate effects of diffraction of the reactive ion beam 230 at the transition of a scan 110 of reactive ion beam from the masked area 122 of the carrier proximity mask, across the edge 222 of the opening 124. In many embodiments, the current density of the reactive ion beam may be modified during the transition to advantageously minimize or attenuate effects of diffraction of the reactive ion beam 230.

FIGS. 2B, 2C and 3 illustrate alternative clamping arrangements for the carrier proximity mask. FIG. 2B illustrates a vertical cross-section of the z-x plane of a first carrier body 100 with an extension 216 clamped at a non-critical contact area 126 of the first carrier body 100 and with a non-critical contact area 220 of the substrate 210 such as an exclusionary edge of the substrate 210. The clamp 226 also clamps an extension 218 of the second carrier body 102 or 104 at a non-critical contact area 126 of the second carrier body 102 or 104 with a non-critical area 222 of the substrate 210. FIG. 2B illustrates an embodiment having a substrate 210 with the same diameter as the carrier bodies 100, 102, and 104.

The clamp 226 may comprise any type of clamping device compatible with the carrier bodies 100, 102, and 104, and with the process tool. For instance, the clamp 226 may comprise a mechanical clamp, an electrostatic clamp, or the like. Note that the second side of the substrate 210 is an opposite side of the substrate 210 from the first side of the substrate 210.

FIG. 2C illustrates a vertical cross-section of the z-x plane of a first carrier body 100 clamped at a non-critical contact area 126 of the first carrier body 100 with a non-critical contact area 220 of the substrate 210 such as an exclusionary edge of the substrate 210. In this embodiment, a contact 220 is formed on the edge of the substrate 210 at the contact area 220 of the first carrier body 100. The contact 220 formed on the substrate 210 at the non-critical contact area 126 may be, a film, metal, or any other material suitable for clamping the substrate 210 with the carrier bodies 100 and 102 or 104. The clamp 226 also clamps a contact 222 formed on the second side of the substrate 210 with of the second carrier body 102 or 104 at a non-critical contact area 126 of the second carrier body 102 or 104 with a non-critical area 126 of the substrate 210. FIG. 2B illustrates an embodiment having a substrate 210 with the same diameter as the carrier bodies 100, 102, and 104.

FIG. 2D illustrates a vertical cross-section of the z-x plane of a first carrier body 106 clamped at a non-critical contact area 126 of the first carrier body 106 with a non-critical contact area 126 of the second carrier body 106. In this embodiment, the first and second carrier bodies 106 have a greater diameter than the diameter of the substrate 210. As a result, the substrate 210 is clamped between the first and second carrier bodies 106 at a non-critical contact area 128. Similar to the embodiment in FIG. 2A, the substrate 210 may have a film on the first side and/or the second side of the substrate 210 at the contact area 128. In other embodiments, similar to the embodiments illustrated in FIGS. 2B and 2C, a contact may be formed on the substrate 210 at the contact are 128 and/or the first and/or second carrier bodies 106 may include an extension protruding towards the substrate 210 to contact the substrate 210 or a contact on the substrate 210 when the first carrier body 106 is clamped with the second carrier body 106 at the non-critical contact area 126.

In the present embodiment, the first carrier body 106 includes an extension 252 extending towards the substrate 210 and coupling with the substrate via a film 254 to suspend the work areas of the substrate 210 between the first and second carrier bodies 106. The second carrier body 106 includes an extension 258 extending towards the substrate 210 and coupling with the substrate 210 via the film 256 to suspend the work areas of the substrate 210 between the first and second carrier bodies 106.

The first carrier body 106 includes an extension 216 at a non-critical contact area 126 extending towards the second carrier body 106 and the second carrier body 106 includes an extension 218 in the non-critical contact area 126 extending towards the first carrier body 106. The clamp 226 may maintain contact between the extensions 216 and 218 to clamp the substrate 210 between the extensions 252 and 258 of the first and second carrier bodies, respectively. Furthermore, the cross-sections of FIGS. 2A-2C and 2D illustrate a single clamp of a set of one or more claims designed to maintain contact between the corresponding carrier bodies 100, 102, 104, and/or 106.

In further embodiments of the disclosure, angled ions may be provided as an ion beam 230 or 242 to etch trenches such as the trenches 228 illustrated in FIG. 2A.

Figures 3A, 3B, 3C, 3D:
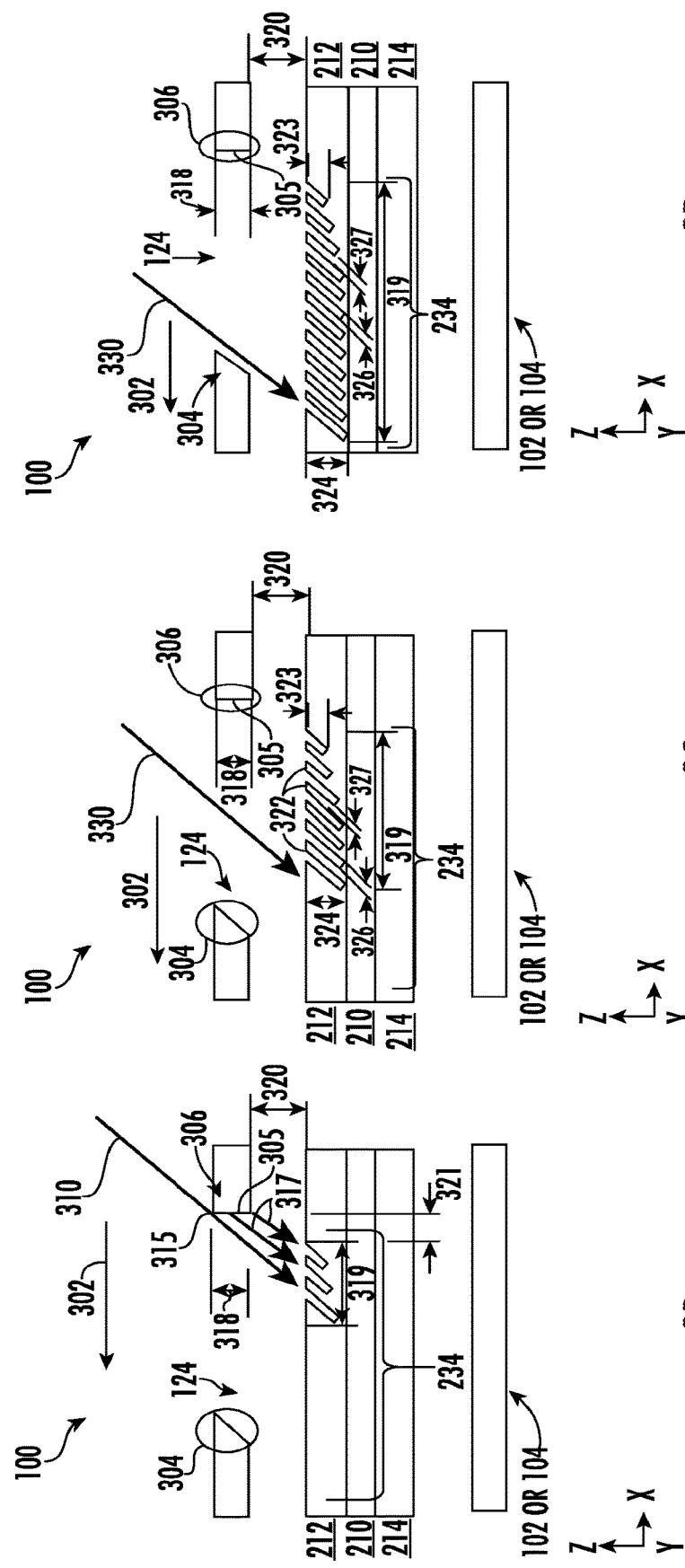
FIG. 3A depicts an embodiment of a system including augmented reality glasses with a focused light source, diffractive optical elements, and wave guides.
FIGS. 3B-D depicts a portion of a side cross-sectional view of an embodiment of a carrier proximity mask with an opening that has edges to convolve with an angle ion beam as the angled ion beam begins and finishes a scan across the opening, to create a variable etch depth profile, according to embodiments of the disclosure.

FIG. 3A depicts an embodiment of a wearable display system 332 including augmented reality glasses with a focused light source 339 located in the frame 335 and lenses 333 comprising diffractive optical elements 334 and 338 and wave guides 336. The lenses 333 may comprise two of multiple devices formed on the substrate 210 shown in FIG. 2A and the implementation of an embodiment of a carrier proximity mask such as the carrier proximity masks illustrated in FIGS. 1A-D, 2A-D, and 3B-G may advantageously facilitate formation of diffractive optical elements 334 and 338 and/or wave guides 336 via the ion beams discussed in conjunction with FIGS. 3H-I.

The wearable display system 332 is arranged to display an image within a short distance from a human eye. Such wearable headsets are sometimes referred to as head mounted displays and are provided with a frame displaying an image within a few centimeters of the user's eyes. The image can be a computer-generated image on a display, such as a micro display. The optical components, such as the diffractive optical elements 334 and 338 and wave guides 336, are arranged to transport light of the desired image, where the light is generated on the display to the user's eye to make the image visible to the user. The display where the image is generated can form part of a light engine, such that the image generates collimated light beams. The beams can be guided by the diffractive optical elements 334 and 338 and wave guides 336 to provide an image visible to the user.

In the present embodiment, FIG. 3A depicts a simple embodiment of the wearable display system 332. The wearable display system 332 comprises the focused light source 339 such as a microprojector, input diffractive optical elements 334, wave guides 336, and output diffractive optical elements 338. Other embodiments may include more optical components and the arrangement of the optical components is implementation specific.

The focused light source 339 may output focused light into the input diffractive optical elements 334. The focused light may enter the lenses via the input diffractive optical elements 334 at a total internal reflection (TIR) critical angle such as 45 degrees and, as a result, the focused light may become trapped in the lenses 333. The wave guides 336 may direct the focused light through the lenses 333 and the output diffractive optical elements 338 may output the focused light toward a user's eye to present the augmented reality images to the user.

In some embodiments, the left and right lenses 333 may have different focused light sources 339. For instance, some embodiments provide different images to the user's left eye and right eye to present the user with a three-dimensional image. Other embodiments may provide a delayed image or an offset image to one of the lenses 333 to simulate or approximate three-dimensional imagery.

FIGS. 3B-D illustrate a vertical cross-section of the Z-X plane of a first carrier body 100 clamped with a second carrier body 102 or 104. In this embodiment, an angled, reactive ion beam 310 scans across the first carrier body 100 along a path in an X-Z plane in a direction 302. While the angled, reactive ion beam 310 scans across a masked part of the first carrier body 100, the current density of the angled, reactive ion beam 310 may be at a low current density to advantageously conserve resources such as power and ions. The current density of the angled, reactive ion beam 310 may be increased as the angled, reactive ion beam 310 approaches the edge of an opening to convolve with the edge to form a desired diffraction profile based on the shape of the edge and the current density of the angled, reactive ion beam 310.

In FIG. 3B, the angled, reactive ion beam 310 scans across the edge 306 of the opening 124. As the angled, reactive ion beam 310 scans across the edge 306 of the opening 124, the angled, reactive ion beam 310 may include an ion beam component 315 that passes directly through the opening 124 and an ion beam component that bends around the edge 306 as a result of the wave properties of light. The ion beam component that bends around the edge 306 may form a diffraction profile 317. The diffraction profile 317 may form based on constructive and destructive inference of portions of the ion beam component that bends around the edge 306 and reflects off a face 305 of the edge 306. In particular, as the processing tool scans 302 the angled, reactive ion beam 310, an increasing portion (component 315) of the angled, reactive ion beam 310 will pass directly through the opening 124 and a decreasing portion of the angled, reactive ion beam 310 will bend around the edge 306.

In the present embodiment, the portion of the angled, reactive ion beam 310 will bend around the edge 306 and reflect off the face 305 of the edge 306. The edge 306 is squared in the present embodiment but other embodiments may include edges with different shapes such as chamfered edges. Depending on the wavelength of the angled, reactive ion beam 310, the frequency of the angled, reactive ion beam 310, and the scan speed of the scan 302, portions of the angled, reactive ion beam 310 may reflect off the entire height of the face 305 of the edge 306 from the side of the first carrier body 100 facing the substrate 210 to the side of the first carrier body 100 facing away from the substrate 210. The reflections of the angled, reactive ion beam 310 may transform as a result of destructive and constructive interference to create the diffraction profile 317. Furthermore, note that the face 305 of the edge 306 may not be a perfect reflector so a portion of the angled, reactive ion beam 310 will also refract into the first carrier body 100, which reduces the current density of the reflection of the angled, reactive ion beam 310.

To illustrate, the processing tool may emit the angled, reactive ion beam 310 at a 45-degree angle of incidence with respect to the plane of the substrate 210. As the angled, reactive ion beam 310 scans towards the edge 306, there may be no component 315 but portions of the angled, reactive ion beam 310 at or near a peak of the waveform of the angled, reactive ion beam 310 may pass through the opening and reflect off the face 305 of the edge 306 of the opening 124 of the first carrier component 100. As the angled, reactive ion beam 310 scans closer to the edge 306, increasing portions of the angled, reactive ion beam 310 will bend around the edge 306 and reflect off the face 305 of the edge 306 towards the substrate 310 in the diffraction profile 317 at a 45-degree angle due to the 90-degree angle of the face 305 of the edge 306 (a squared edge). The overlapping reflections may interfere with one another, subtracting from the current density of the portion of the angled, reactive ion beam 310 and adding to the current density of the reflected portion of the angled, reactive ion beam 310 in a regular pattern based on the duty cycle, or modulation, of the angled, reactive ion beam 310 and the frequency of the angled, reactive ion beam 310.

When the diffraction profile 317 of the portion of the angled, reactive ion beam 310 that bent around the edge 306 reaches the film 212 on the substrate 210, the diffraction profile 317 may etch the film 212 based on the varying current densities of reflected portions of the diffraction profile 317. More specifically, as the angled, reactive ion beam 310 scans the first carrier body 100 closer to the edge 306, the portions of the angled, reactive ion beam 310 that bend around the edge 306 will reach further down the face 305 of the edge 306 and an increasing portion of the angled, reactive ion beam 310 will pass directly through the opening 124 as the angled, reactive ion beam 310 also hits portions of the face 305 closest to the substrate 210. As a result, the current densities of the diffraction profile 317 may increase as the angled, reactive ion beam 310 reflects off portions of the face 305 closer to the substrate. Furthermore, when the portions of the angled, reactive ion beam 310 reflect off the face 305, portions of the angled, reactive ion beam 310 will also refract into the first carrier body 100 via the face 305 of the edge 306, decreasing the current densities of the diffraction profile 317.

The portion of the angled, reactive ion beam 310 that reflects off the lowest points on the face 305 may have the lowest current density and the portions of the angled, reactive ion beam 310 that reflects off the highest points on the face 305 may have the highest current density. Furthermore, the current density of the angled, reactive ion beam 310 may be varied to adjust the current densities associated with the diffraction profile 317 by varying the duty cycle of the angled, reactive ion beam 310 or the scan 302 speed, which is the speed at which the angled, reactive ion beam 310 scans across the edge 306. As shown in the FIG. 3B, the diffraction profile 317 may etch a variable etch depth profile 319 in the film 212, or the substrate 210 in some embodiments.

The variable etch depth profile 319 may have a plurality of angled structures along a plane of the substrate 210. The plurality of angled structures may define a depth profile that varies along a length of the depth profile in the X-Z plane, across a width of the opening 124 in the X-Z plane and parallel to the plane of the substrate 210 (X-Y plane). The variable etch depth profile 319 may begin within the work area 234 associated with the opening 124 at a distance 321, across the width of the opening 124, from the edge 306. In further embodiments, the edge 304 of the opening 124 may be designed to eliminate or minimize any reflection, refraction, or diffraction of the angled, reactive ion beam 310 to avoid modification of the variable etch depth profile 319.

The process of scanning an ion beam across an edge such as the edge 306 and into an opening such as the opening 124 is referred to herein as convolving the ion beam with the edge. Although not illustrated herein, the same process can convolve the ion beam with an edge such as the edge 304 as the scan of the ion beam crosses from an opening 124 over the edge 304 and towards, a masked area of a carrier body of the carrier proximity mask.

In FIG. 3B, the angled, reactive ion beam 310 scans 302 across the opening 124 after scanning across the edge 306. As the angled, reactive ion beam 310 scans across the opening, a duty cycle (or modulation) of the angled, reactive ion beam 330 may establish the distance between the trenches 322 etched into the film 212, the depth 324 of the trenches 322, as well as the thickness 326 of the trenches. In some embodiments, the scan speed and/or duty cycle of the angled, reactive ion beam 310 over the opening 124 may be varied or modified with respect to the scan speed and/or duty cycle while the angled, reactive ion beam 310 scanned the edge 306. Such adjustments may modify the distance between the trenches 327, the trench depth 324 and/or the trench thickness 326. In some embodiments, the spacing between the trenches 322 etched via the direct application of the angled, reactive ion beam 310 on the film 212.

FIG. 3D illustrates the scan 302 of the angled, reactive ion beam 330 after the scan 302 reaches edge 304 of the opening 124. The shape of the edge 304 may be designed to prevent or eliminate effects of diffraction, refraction, and/or reflection of the angled, reactive ion beam 330 towards the substrate 210 to avoid any detrimental modifications of the variable etch depth profile 319. In other embodiments, the shape of the edge 304 may be designed to convolve with the angled, reactive ion beam 330 to perform additional etching of the variable etch depth profile 319.

Many embodiments may modify the current density of the angled, reactive ion beam 310 as the scan 302 of the angled, reactive ion beam 310 transitions to the opening 124. Such modifications may adjust the actual variable etch depth profile 319 to match or approximate the desired variable etch depth profile. In many embodiments, the actual variable etch depth profile 319 is calculated and compared to the desired variable etch depth profile through simulation of the scanning process to determine differences between the actual variable etch depth profile 319 and the desired variable etch depth profile.

FIGS. 3E-F depicts a plan view of a carrier proximity mask and a portion of a wafer with work areas exposed to a processing tool via openings with edges in the carrier proximity mask to create a variable etch depth profile. FIG. 3E depicts a plan view of the first carrier body 100 with clamps 126 to couple a substrate 210 between the first carrier body 100 and the second carrier body 102 or 104 (not visible). The first carrier body 100 includes openings 124 and masked areas 122.

FIG. 3F depicts a portion of a substrate 210 with work areas exposed to a processing tool via openings 124 with edges in the first carrier body 100 to create a variable etch depth profile. The processing tool may scan an angled, reactive ion beam 330 across a square edge of the opening 124 to convolve the angled, reactive ion beam with the square edge and create a diffraction profile to create a first portion of the variable etch depth profile. The processing tool may scan an angled, reactive ion beam 330 across the opening 124 to create a second portion of the variable etch depth profile.

FIG. 3G depicts a cross-section of a portion of the work area of the substrate 210 with an actual variable etch depth profile 319 created by the processes described in conjunction with FIGS. 3B-3D with the carrier proximity mask and substrate shown in FIGS. 3E-F. The actual variable etch depth profile 319 may comprise a plurality of angled structures 341 along a plane of the substrate 210. The plurality of angled structures 341 may define a depth profile 359. The depth profile 359 varies along a length of the depth profile in parallel with the plane of the substrate and across a portion of the width of the opening 124. The plurality of angled structures 341 may also define a depth profile 358. The depth profile 358 is constant along a length of the depth profile in parallel with the plane of the substrate and across a portion of the width of the opening 124. In some embodiments, the angled, reactive ion beam 330 may be directed at a 45-degree angle of incidence with respect to the plane of the substrate 210. In such embodiments, the angled, reactive ion beam 330 may etch a 45-degree trench into the film 212 on the substrate 210 with a thickness related to the duty cycle and scan speed of the angled, reactive ion beam 330 as well as a beam etch profile. In other embodiments, the angled, reactive ion beam 330 may be directed at the at an angle of incidence between zero and 90 degrees with respect to the plane of the substrate 210.

In the present example, the gap between the first carrier body 100 and the film 212 on the substrate 210 is 0.2 millimeter (mm) and the trenches are etched at an angle theta, θ, which is at a 45-degree angle of incidence with respect to the plane of the substrate 210 or at a 45-degree angle of incidence with respect to a plane perpendicular to the plane of the substrate 210. The gap affects the width of the diffraction profile 317 at the surface of the substrate 210 or film 212, which is shown as the depth profile 359. An embodiment with a gap larger than 0.2 mm, such as 0.8 mm or 1.2 mm, may have a depth profile 359 with a greater width and may begin a farther distance from the edge 306 of the opening 124. Furthermore, the height 318 of the face 305 affects the width of the diffraction profile 317 and, thus, the depth profile 359.

The present embodiment illustrates distances with respect to the edge 306 with the lines 340 through 354 at 0.2 mm increments. In particular, the line 340 indicates the 0.0 mm point on the variable etch depth profile 319. The 0.0 mm point is the point on the substrate 210 directly below the face 305 of the edge 306 in the X-Z plane. The line 342 shows 0.2 mm distance from the edge 306. The line 344 shows 0.4 mm distance from the edge 306. The line 346 shows 0.6 mm distance from the edge 306. The line 348 shows 0.8 mm distance from the edge 306. The line 350 shows 1.0 mm distance from the edge 306. The line 352 shows 1.2 mm distance from the edge 306. And the line 354 shows 1.4 mm distance from the edge 306.

At distances of about 1.4 mm and farther from the edge 306 of the opening 124, along the plane of the substrate 210 (X-Y plane), the trenches 341 define a constant trench depth 356 of approximately 220 nanometers (nm).

FIG. 3H depicts alternative embodiments of shapes of edges for openings in the carrier proximity mask. In particular, the edges 360 and 362 replace the edge 306 in the embodiments shown in FIGS. 3B-G. The edges 360 and 362 show two different chamfered edges. Both edges 360 and 362 are chamfered to reduce the heights 366 and 368, respectively, of the faces 364. With respect to the shape of edge 360, the edge 360 may be created by, e.g., squaring and chamfering the edge 360 to create an angled surface to convolve with the angled, reactive ion beam to reflect portions of the angled, reactive ion beam away from the substrate 210. With respect to the shape of edge 362, the edge 362 may be created by, e.g., squaring and chamfering the edge 362 to create an angled surface. The angled surface may not convolve with the angled, reactive ion beam due to the positioning of the angled surface. Note the chamfering of the edge 362 also changes the distance of the face 309 from the surface of the substrate 210, which has a similar effect as adjusting the gap between the first carrier body 100 and the surface of the substrate 210. For both of chamfered edges 360 and 362, the width of the diffraction profile may be reduced, which would reduce the width of the variable etch depth profile 359 illustrated in FIG. 3G.

FIG. 3I depicts an embodiment of a chart 370 illustrating a desired variable etch depth profile 372, an actual variable etch depth profile 374, and a delta 376 between the variable etch depth profiles for two adjacent carrier proximity mask openings for the embodiments illustrated in FIGS. 3E-G. The desired variable etch depth profile 372 shows a depth profile beginning at a depth 371 at a distance from the edge of 377. Thereafter, the desired variable etch depth profile 372 closely tracks the actual variable etch depth profile 374. Note the actual variable etch depth profile 374 begins closer to the edge 306 of the opening 124. In some embodiments, the width of the actual variable etch depth profile 374 can be adjusted by chamfering the squared edge such as that edges 360 and 362 shown in FIG. 3H. Furthermore, the distance from the edge 306 at which the actual variable etch depth profile 374 begins can be adjusted by adjusting the distance of the face 305 from the surface 210 of the substrate 210. Adjusting the distance of the face 305 from the surface 210 of the substrate 210 can be accomplished by, e.g., adjusting the gap between the carrier proximity mask and the surface of the substrate 210 or by, e.g., chamfering the bottom of the squared edge to create an edge shape such as the edge 362.

The chart 370 exaggerates the delta 376 between the actual variable etch depth profile 374 and the desired variable etch depth profile 372 to more clearly show how the profiles differ and the locations at which the profiles differ.

FIG. 3J depicts an embodiment of a chart 380 illustrating an etching beam profile 384 and duty cycle 382 to convolve with a square edge of an opening in a carrier proximity mask to create the variable etch depth profile in a wafer as shown in FIG. 3I. The graph of the etching beam profile 384 illustrates the shape of the angled, reactive ion beam 330 that scans across the opening 124 in the first carrier body 100 discussed in conjunction with FIGS. 2A and 3B-G. Note the etching beam profile 384 is not square so different portions of the beam has different current densities. The different current densities affect the diffraction profile 317 when the beam is convolved the edge 306 or the chamfered edges 360 or 362.

The duty cycle 382 of the beam are modulated to provide increased beam modulation weights to etch the trenches 322 and decreased beam modulation weights to form the parallel structures 341 that define the distance 327 between the trenches 322.

Figure 4C:
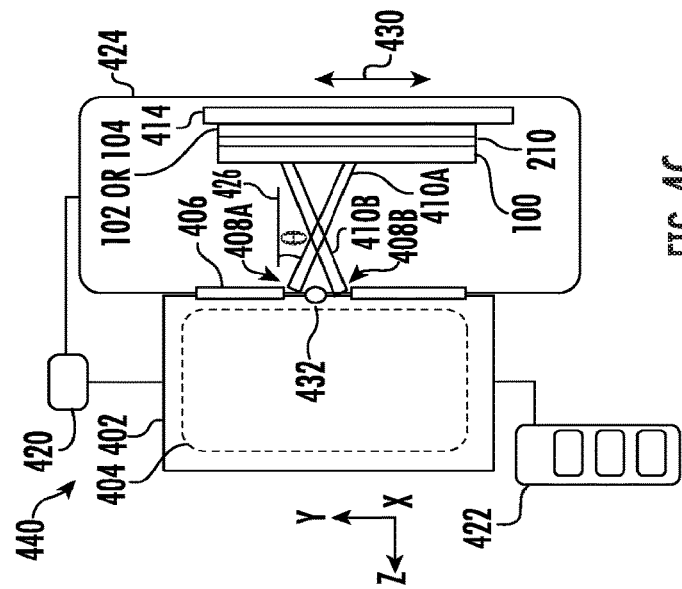
FIG. 4C shows another processing apparatus, depicted in schematic form, in accordance with embodiments of the disclosure.
Figure 4A:
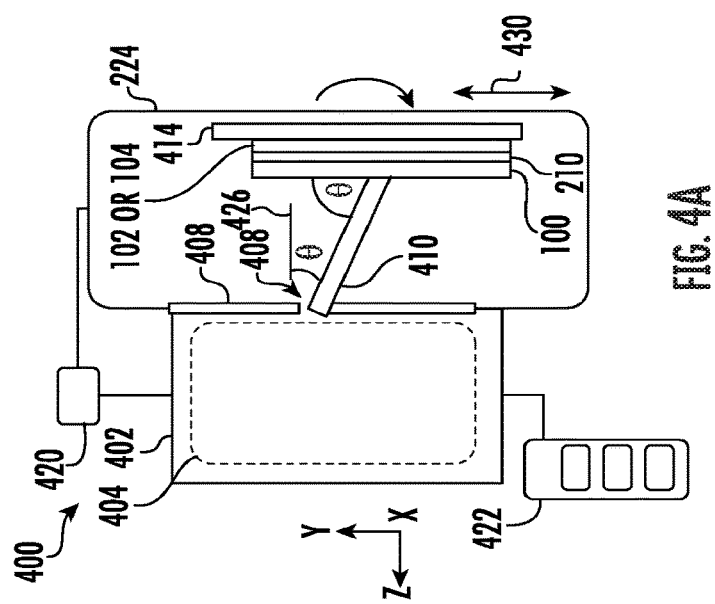
FIG. 4A shows a processing apparatus, depicted in schematic form, in accordance with embodiments of the disclosure.

Turning now to FIG. 4A, there is shown a processing apparatus 400, depicted in schematic form. The processing apparatus 400 represents a processing apparatus for performing anisotropic or isotropic reactive ion etching. The processing apparatus 400 may be a plasma-based processing system having a plasma chamber 402 for generating a plasma 404 therein by any convenient method as known in the art. An extraction plate 406 may be provided as shown, having an extraction aperture 408, where an angled ion beam 410 may be extracted to direct angled ions 230 or 242 to a substrate 210. The substrate 210, including structures created thereon, is disposed in the process chamber 424. A substrate plane of the substrate 210 is represented by the X-Y plane of the Cartesian coordinate system shown, while a perpendicular to the plane of substrate lies along the Z-axis (Z-direction).

As further shown in FIG. 4A, the angled ion beam 410 may be extracted when a voltage difference is applied using bias supply 420 between the plasma chamber 402 and substrate 210 via an opening 124 in a first carrier body 100 of a carrier proximity mask, or substrate platen 414, as in known systems. The bias supply 420 may be coupled to the process chamber 424, for example, where the process chamber 424 and substrate 210 are held at the same potential.

According to various embodiments, the angled ion beam 410 may be extracted at a non-zero angle of incidence, shown as Φ, with respect to the perpendicular 426. The trajectories of ions within the angled ion beam 410 may be mutually parallel to one another or may lie within a narrow angular range, such as within 10 degrees of one another or less. Thus, the value of Φ may represent an average value of incidence angle where the individual trajectories vary up to several degrees from the average value. In some embodiments, the angle of Φ may be, e.g., 12 degrees, to form a sidewall in a trench with a 78-degree angle of inclination.

In various embodiments, the angled ion beam 410 may be extracted as a continuous beam or as a pulsed ion beam as in known systems. For example, the bias supply 420 may be configured to supply a voltage difference between plasma chamber 402 and process chamber 424, as a pulsed, direct current (DC) voltage, where the voltage, pulse frequency, and duty cycle of the pulsed voltage may be independently adjusted from one another.

In various embodiments, a suitable gas or combination of gases, may be supplied by the source 422 to plasma chamber 402. The plasma 404 may generate various species to perform reactive ion beam etching, depending upon the exact composition of species provided to the plasma chamber 402. The species provided by source 422 may be designed according to material to be etched, such as known reactive ion etching species for etching silicon.

Figure 4B:
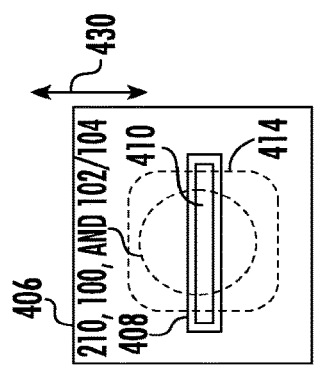
FIG. 4B depicts a face view of an extraction arrangement for the processing apparatus of FIG. 4A.

In various embodiments, the angled ion beam 410 may be provided as a ribbon ion beam having a long axis extending along the X-direction of the Cartesian coordinate system shown in FIG. 4B. By scanning a substrate platen 414 including substrate 210 with respect to the extraction aperture 408, and thus with respect to the angled ion beam 410 along the scan direction 430, the angled ion beam 410 may etch exposed portions of the substrate 210 via openings 124 in the first carrier body 100 as well as a film 212 on the first side of the substrate 210 in some embodiments. In many embodiments, the angled ion beam does not etch a hard mask 226 illustrated in FIG. 2A.

In this example of FIG. 4B, the angled ion beam 410 is provided as a ribbon ion beam extending to a beam width along the X-direction, where the beam width is adequate to expose an entire width of the substrate 210, even at the widest part along the X-direction. Exemplary beam widths may be in the range of 10 cm, 20 cm, 30 cm, or more while exemplary beam lengths along the Y-direction may be in the range of 2 mm, 3 mm, 5 mm, 10 mm, or 20 mm. A ratio of beam width to beam length may be in the range 5/1, 10/1, 20/1 50/1, or 100/1. The embodiments are not limited in this context.

Notably, the scan direction 430 may represent the scanning of substrate 210 in two opposing (180 degrees) directions along the Y-direction, or just a scan toward the left or a scan toward the right. The long axis of angled ion beam 410 extends along the X-direction, perpendicularly to the scan direction 430. Accordingly, an entirety of the substrate 210 may be exposed to the angled ion beam 410 when scanning of the substrate 210 takes place along a scan direction 430 to an adequate length from a left side to right side of substrate 210.

In accordance with various embodiments, the angled ions 230 and 242 may be supplied in a plurality of scans of the substrate 210, by rotating the substrate 210 through 180 degrees between scans. Thus, in a first scan, the angled ions 230 and 242 may be directed to the sidewall, while in a second scan the angled ions 230 and 242 may be directed to another sidewall, by rotating the substrate 210 180 degrees between the first scan and second scan, while not changing the actual orientation of an ion beam, such as angled ion beam 410.

In other embodiments of the disclosure, a modified apparatus may be used to provide simultaneous etching of a substrate in different directions. Turning now to FIG. 4C, there is shown another processing apparatus 440, depicted in schematic form. The processing apparatus 440 represents a processing apparatus for performing angled ion treatment of a substrate and may be substantially the same as the processing apparatus 400, save for the differences discussed below. Notably, the processing apparatus 440 includes a beam blocker 432, disposed adjacent the extraction aperture 408. The beam blocker 432 is sized and positioned to define a first aperture 408A and a second aperture 408B, where the first aperture 408A forms a first angled ion beam 410A, and the second aperture 408B forms a second angled ion beam 410B. The two angled ion beams may define angles of incidence with respect to the perpendicular 426, equal in magnitude, opposite in direction. The beam blocker offset along the Z-axis with respect to extraction plate 406 may help define the angle of the angled ion beams. As such, the first angled ion beam 410A and the second angled ion beam 410B may treat opposing sidewalls of a trench similarly and simultaneously, as generally depicted in FIG. 2A. When configured in the shape of a ribbon beam as in FIG. 4B, these angled ion beams may expose an entirety of the substrate 210 to reactive ion etching of the substrate 210 to the extent the substrate is exposed via openings 124 in the first carrier body 100 by scanning the substrate platen 414 as shown.

After processing the substrate 210 via the openings 124 in the first carrier body 100, the carrier proximity mask can be flipped by the processing tool or other tool to facilitate processing of the second side of the substrate 210 via openings in a second carrier body 102 if the secondary carrier body 102 or 104 includes openings.

FIG. 5 depicts an embodiment of a process flow 500, according to embodiments of the disclosure. At block 502, a substrate is provided. The substrate may comprise any type of substrate for processing. In many embodiments, the substrate is in the form of a wafer having a specific diameter such as 50 mm, 100 mm, 200 mm, or 300 mm. The substrate may further comprise one or more layers of a film, a hard mask, and/or a soft mask.

At block 504, a first carrier body is provided such as the carrier bodies illustrated in FIGS. 1A-1D, 2A-2C, and 3. The first carrier body may have one or more openings and the one or more openings may form proximity masks to form structures on a first side of a substrate. The first carrier body may have one or more contact areas and the contact areas may align with one or more contact areas on the first side of the substrate. In some embodiments, the one or more openings in the first carrier body may include at least one edge having an angle of declination, theta, with respect to a horizontal plane of the substrate.

At block 506, a second carrier body is provided. The second carrier body may have one or more contact areas, the contact areas to align with one or more contact areas on a second side of the substrate. In some embodiments, the second carrier body may comprise one or more openings and the one or more openings may act as proximity masks to form structures on the second side of the substrate.

At block 508, a set of one or more clamps may clamp the first carrier body with the second carrier body. Furthermore, the one or more contact areas of the first carrier body and the one or more contact areas of the second carrier body may contact opposite sides of the substrate to suspend a work area of the first side of the substrate and a work area of the second side of the substrate between the first carrier body and the second carrier body. In some embodiments, the first carrier body and the second carrier body may provide structural support for the substrate to reduce deformation of the substrate during processing. In further embodiments, the first carrier body and the second carrier body may comprise a conductive or semi-conductive material and the set of one or more clamps may comprise electrostatic clamps to electrostatically clamp the first carrier body with the second carrier body.

At block 510, the process may align one or more of the contact areas of the first carrier body with exclusion areas of the first side of the substrate and one or more of the contact areas of the second carrier body with exclusion areas of the second side of the substrate. In some embodiments, the contact areas to align with exclusion areas of the first side of the substrate may comprise at least one contact area to align with an exclusionary edge of the substrate on the first side of the substrate. Furthermore, the contact areas to align with exclusion areas of the second side of the substrate may comprise at least one contact area to align with the exclusionary edge of the substrate on the second side of the substrate.

In one embodiment, the one or more openings on the first carrier body may align with locations to form the structures in the work area on the first side of the substrate and the one or more openings on the second carrier body may align with locations to form the structures in the work area on the second side of the substrate. In such embodiments, the one or more contact areas of the first carrier body may comprise contact areas to align with exclusion areas of the first side of the substrate and the one or more contact areas of the second carrier body comprise contact areas to align with exclusion areas of the second side of the substrate.

FIG. 6 depicts an exemplary process flow 600 utilizing a carrier proximity mask such as the carrier proximity masks illustrated in FIGS. 1A-1D, 2A-2C, and 3, according to embodiments of the disclosure. At block 602, a substrate in a carrier proximity mask is provided. The substrate may have a work area of a first side of the substrate and a work area of a second side of the substrate between a first carrier body of the carrier and a second carrier body of the carrier. The substrate may be suspended between the first carrier body and the second carrier body.

The first carrier body may have one or more openings formed as proximity masks and the one or more openings may facilitate formation of structures on a first side of the substrate. The first carrier body may also have one or more contact areas and the contact areas may align with one or more contact areas on the first side of the substrate. The second carrier body may also have one or more contact areas and the contact areas may align with one or more contact areas on a second side of the substrate. In many embodiments, the one or more contact areas of the first carrier body and the one or more contact areas of the second carrier body may contact opposite sides of the substrate.

At block 604, the flowchart may process, with a processing tool, the work area on the first side of the substrate via the one or more openings to form the structures on the first side of the substrate. Areas of the first carrier body may mask portions of the work area on the first side of the substrate. In some embodiments, the processing may involve directing angled ions across an angled slope of at least one edge of the one or more openings of the first carrier body.

At block 606, the flowchart may flip the carrier proximity mask with the processing tool or another tool, to process the second side of the substrate through the one or more openings of the second carrier body.

At block 608, the flowchart may process a work area on the second side of the substrate via one or more openings in the second carrier body. The processing may comprise directing angled ions across an angled slope of at least one edge of the one or more openings of the first carrier body. In other embodiments, the processing may comprise doping the work area via an opening in the second carrier body. In further embodiments, the processing may comprise deposition via the openings in the second carrier body via physical vapor deposition, chemical vapor deposition, or ion beam sputtering. In still other embodiments, the processing may comprise lithography. For instance, photoresist may be applied via the openings in the second carrier body, ultraviolet light may alter the photoresist to provide an etching mask, and portions of the exposed substrate or film may be selectively removed based on the pattern of photoresist.

FIG. 7 depicts an embodiment of a process flow 700, according to embodiments of the disclosure. At block 702, a substrate is provided. The substrate may comprise any type of substrate for processing. In many embodiments, the substrate is in the form of a wafer having a specific diameter such as 50 mm, 100 mm, 200 mm, or 300 mm. The substrate may further comprise one or more layers of a film, a hard mask, and/or a soft mask.

At block 704, a carrier is provided. The carrier may comprise a first carrier body coupled with a second carrier body and the substrate may be coupled between the first carrier body and the second carrier body. The first carrier body may have one or more openings to expose work areas of the substrate on the first side of the substrate. Furthermore, the one or more openings having edges. In some embodiments, one or more of the edges may be squared. In further embodiments, the one or more of the edges may be chamfered to reduce the length of the variable etch depth profile.

At block 704, the process flow 700 may convolve a first edge of the edges in a first opening with a beam from a processing tool to create a convolved beam. The convolved beam may comprise a diffraction profile based on the frequency of the beam, the beam profile or shape of the beam, the shape of the edge, and the height of the face of the edge. In many embodiments, the convolved beam is a diffraction profile of reflected components of the beam generated by a processing tool. The diffraction profile may etch a work area of the substrate exposed by the first opening to create a variable etch depth profile in the substrate proximate to the first edge.

The variable etch depth profile may comprise a plurality of angled structures along a plane of the substrate and the plurality of angled structures may define a depth profile that varies along a length of the variable etch depth profile. The length may be parallel to the plane of the substrate and protrude across a width of the first opening on the surface of the substrate.

Figure 8:
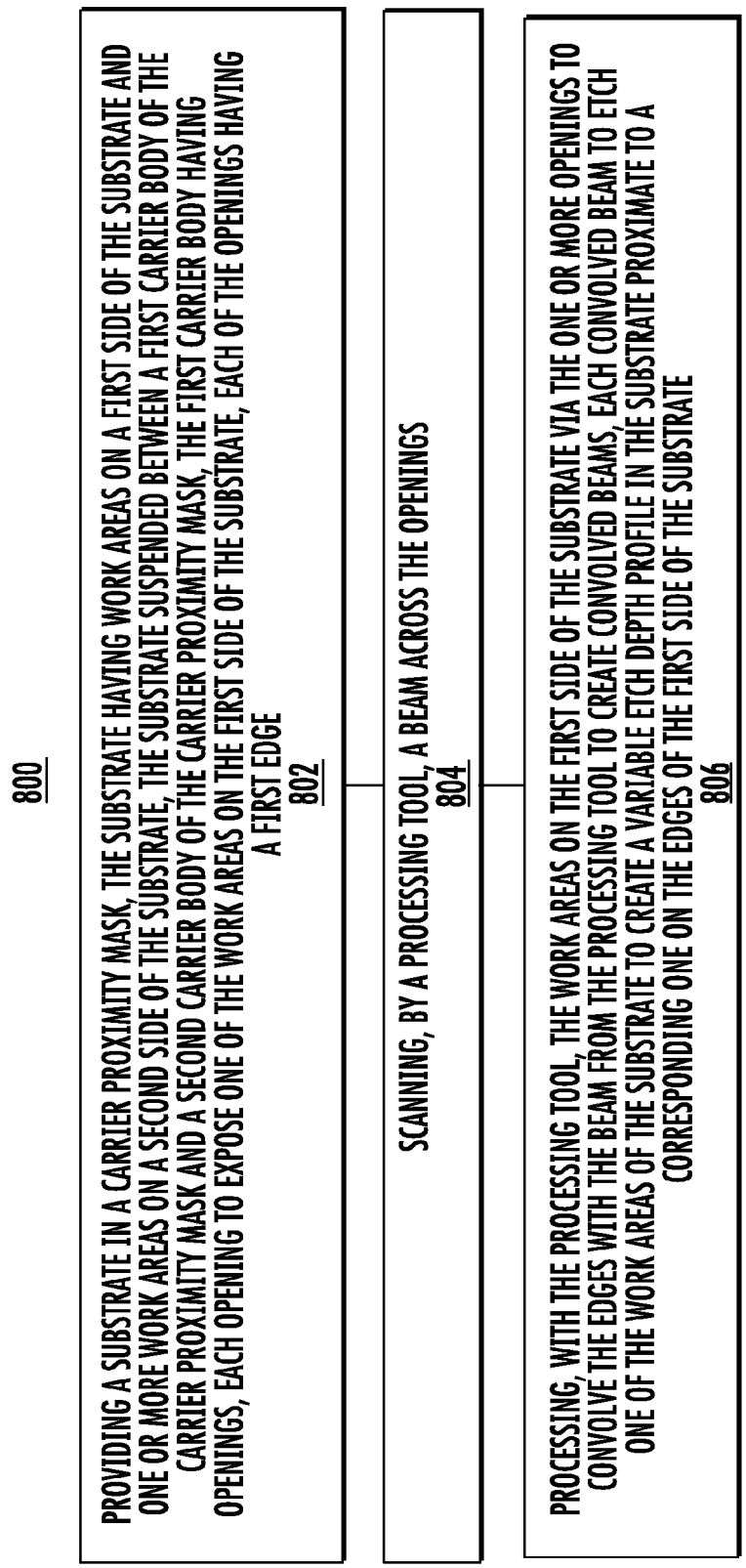
FIG. 8 shows another exemplary process flow, according to further embodiments of the disclosure.

FIG. 8 depicts an exemplary process flow 800 utilizing a carrier proximity mask such as the carrier proximity masks illustrated in FIGS. 1A-1D, 2A-2C, and 3, according to embodiments of the disclosure. At block 802, a substrate in a carrier proximity mask is provided. The substrate may comprise work areas on a first side of the substrate and one or more work areas on a second side of the substrate. The substrate may be suspended between a first carrier body of the carrier proximity mask and a second carrier body of the carrier proximity mask. The first carrier body may have openings, each opening to expose one of the work areas on the first side of the substrate. Furthermore, each of the openings may have a first edge to convolve with a beam to define a variable etch depth profile.

At block 804, the process flow 800 may scan, by a processing tool, the beam across the openings. At block 806, the process flow 800 may process, with the processing tool, the work areas on the first side of the substrate via the one or more openings to convolve the edges with the beam. Convolving the edges with the beam may create convolved beams with diffraction profiles. Each convolved beam may etch one of the work areas of the substrate to create a variable etch depth profile in the substrate proximate to a corresponding one of the edges on the first side of the substrate.

The first carrier body may mask every other row of devices during a first round of processing, wherein every other row of devices has a different diffractive optical element. In other embodiments, the first carrier body may mask every x number of rows of devices during a first round of processing. In such embodiments, a combination of one or more subsequent carrier masks may expose the remaining rows for processing.

In some embodiments, the processing tool may increase a current density of the beam as the beam transitions from a masked area of the first carrier body to an edge of one of the openings of the first carrier body to adjust an etch depth associated with diffraction of the beam convolved with the edge of the mask, a diffraction profile of the convolved beam based on a frequency of the beam, a shape of the beam, and a shape of the edge. In several embodiments, a processing tool may increase the current density by increasing a duty cycle of the beam, reducing a scan rate of the beam, or a combination thereof.

In some embodiments, the processing tool may decrease a current density of the beam as the beam transitions from an edge of the first carrier body into an opening of the first carrier body. In further embodiments, the shape of at least one of the edges to convolve with the beam comprises a square edge. The square edge may convolve with the beam to form a variable etch depth profile having a length along a plane of the substrate, proportional to a height of a face of the edge. The face may reside on a plane perpendicular to the plane of the substrate and the variable etch depth profile having an angled etch profile. The angled etch profile may have an angle of incidence with respect to the plane of the substrate and the angle of incidence may be less than ninety degrees and more than zero degrees.

In many embodiments, the processing tool may create a variable etch depth profile having a plurality of angled structures along a plane of the substrate. The plurality of angled structures may define a depth profile that varies along a length of the depth profile, across a width of the first opening. The length of the depth profile may also be parallel to the plane of the substrate.

The present embodiments provide various advantages over known processes. Each process step or process tool implemented for processing a substrate can advantageously benefit from use of one or more carrier proximity masks. The carrier proximity masks provide hard masks and openings to advantageously reduce the number of processing steps involved with processing a substrate. For instance, inclusion of a second carrier body without openings such as the second carrier body can advantageously protect structures on the second side of a substrate as well as structures formed via the first side of the substrate by providing a hard mask during physical vapor deposition (PVD) and/or chemical vapor deposition (CVD). Thus, the second carrier body 104 advantageously reduces the number processing steps since a mask does not have to be deposited or applied to the second side of the substrate prior to the PVD or CVD. Reduction in the number of processing steps advantageously saves time and costs. Furthermore, reduction in the size of the areas processed by a tool with the carrier proximity mask advantageously reduces the costs even if the number of steps is not reduced. Another advantage of the carrier proximity mask is handling of flexible glass substrate wafers without having to add or bond metal to the glass to structurally reinforce the glass for processing. Another advantage of the carrier proximity mask is the ability to fine tune the formation of diffraction optical elements by selecting the shape of the edge of an opening and convolving the edge of the opening with an ion beam of a given shape with a selected duty cycle and scan speed.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A carrier proximity mask, comprising:
   a first carrier body, the first carrier body having one or more openings, the one or more openings formed as proximity masks to form structures on a first side of a substrate, the first carrier body having one or more contact areas, the contact areas to align with one or more contact areas on the first side of the substrate;
   a second carrier body having one or more contact areas, the contact areas to align with one or more contact areas on a second side of the substrate; and
   a set of one or more clamps to clamp the first carrier body with the second carrier body;
   the one or more contact areas of the first carrier body and the one or more contact areas of the second carrier body to contact opposite sides of the substrate to suspend a work area of the first side of the substrate and a work area of the second side of the substrate between the first carrier body and the second carrier body, the work area of the first side of the substrate being spaced apart from the first carrier body in a direction perpendicular to the first side of the substrate and the work area of the second side of the substrate being spaced apart from the second carrier body in a direction perpendicular to the second side of the substrate.

2. The carrier proximity mask of claim 1, wherein the one or more contact areas of the first carrier body comprise contact areas to align with exclusion areas of the first side of the substrate and the one or more contact areas of the second carrier body comprise contact areas to align with exclusion areas of the second side of the substrate.

3. The carrier proximity mask of claim 2, wherein the contact areas to align with exclusion areas of the first side of the substrate comprise at least one contact area to align with an exclusionary edge of the substrate on the first side of the substrate and the contact areas to align with exclusion areas of the second side of the substrate comprise at least one contact area to align with the exclusionary edge of the substrate on the second side of the substrate.

4. The carrier proximity mask of claim 1, the first carrier body and the second carrier body to provide structural support for the substrate to reduce deformation of the substrate during processing.

5. The carrier proximity mask of claim 1, the first carrier body and the second carrier body to comprise a conductive or semi-conductive material and the set of one or more clamps to comprise electrostatic clamps to electrostatically clamp the first carrier body with the second carrier body.

6. The carrier proximity mask of claim 1, the one or more openings in the first carrier body to include at least one edge having an angle of declination, theta, with respect to a horizontal plane of the substrate.

7. The carrier proximity mask of claim 6, the second carrier body to comprise one or more openings, the one or more openings formed as proximity masks to form structures on the second side of the substrate.

8. The carrier proximity mask of claim 7, the one or more openings on the first carrier body to align with locations to form the structures in the work area on the first side of the substrate and the one or more openings on the second carrier body to align with locations to form the structures in the work area on the second side of the substrate, wherein the one or more contact areas of the first carrier body comprise contact areas to align with exclusion areas of the first side of the substrate and the one or more contact areas of the second carrier body comprise contact areas to align with exclusion areas of the second side of the substrate.

9. A method of assembling a carrier proximity mask, comprising
   providing a substrate;
   providing a first carrier body, the first carrier body having one or more openings, the one or more openings formed as proximity masks to form structures on a first side of a substrate, the first carrier body having one or more contact areas, the contact areas to align with one or more contact areas on the first side of the substrate;
   providing a second carrier body having one or more contact areas, the contact areas to align with one or more contact areas on a second side of the substrate; and
   clamping a set of one or more clamps to the first carrier body with the second carrier body, the one or more contact areas of the first carrier body and the one or more contact areas of the second carrier body to contact opposite sides of the substrate to suspend a work area of the first side of the substrate and a work area of the second side of the substrate between the first carrier body and the second carrier body, the work area of the first side of the substrate being spaced apart from the first carrier body in a direction perpendicular to the first side of the substrate and the work area of the second side of the substrate being spaced apart from the second carrier body in a direction perpendicular to the second side of the substrate.

10. The method of claim 9, further comprising aligning one or more of the contact areas of the first carrier body with exclusion areas of the first side of the substrate and one or more of the contact areas of the second carrier body with exclusion areas of the second side of the substrate.

11. The method of claim 10, wherein aligning the one or more of the contact areas of the first carrier body comprises aligning at least one of the one or more of the contact areas of the first carrier body with an exclusionary edge of the substrate on the first side of the substrate and aligning the one or more of the contact areas of the second carrier body comprises aligning at least one of the one or more of the contact areas of the second carrier body with the exclusionary edge of the substrate on the second side of the substrate.

12. The method of claim 9, the first carrier body and the second carrier body to provide structural support for the substrate to reduce deformation of the substrate during processing.

13. The method of claim 9, wherein clamping involves electrostatically clamping to the first carrier body with the second carrier body, wherein the set of one or more clamps comprise electrostatic clamps, the first carrier body and the second carrier body to comprise a conductive or semiconductive material.

14. The method of claim 9, the one or more openings in the first carrier body to include at least one edge having an angle of declination, theta, with respect to a horizontal plane of the substrate.

15. The method of claim 14, the second carrier body to comprise one or more openings, the one or more openings formed as proximity masks to form structures on the second side of the substrate.

16. The method of claim 15, further comprising aligning one or more of the contact areas of the first carrier body with exclusion areas of the first side of the substrate and one or more of the contact areas of the second carrier body with exclusion areas of the second side of the substrate, aligning one or more of the contact areas of the first carrier body with exclusion areas of the first side of the substrate, and aligning one or more of the contact areas of the second carrier body with exclusion areas of the second side of the substrate.

17. A method for forming a structure, comprising
providing a substrate in a carrier, the substrate having a work area of a first side of the substrate and a work area of a second side of the substrate between a first carrier body of the carrier and a second carrier body of the carrier, the substrate suspended between the first carrier body and the second carrier body with the work area of the first side of the substrate being spaced apart from the first carrier body in a direction perpendicular to the first side of the substrate and the work area of the second side of the substrate being spaced apart from the second carrier body in a direction perpendicular to the second side of the substrate, the first carrier body having one or more openings, the one or more openings formed as proximity masks to form structures on a first side of the substrate, the first carrier body having one or more contact areas, the contact areas to align with one or more contact areas on the first side of the substrate, the second carrier body having one or more contact areas, the contact areas to align with one or more contact areas on a second side of the substrate, the one or more contact areas of the first carrier body and the one or more contact areas of the second carrier body in contact with opposite sides of the substrate; and
processing, with a processing tool, the work area on the first side of the substrate via the one or more openings to form the structures on the first side of the substrate, wherein areas of the first carrier body mask portions of the work area on the first side of the substrate.

18. The method of claim 17, wherein processing comprises directing angled ions across an angled slope of at least one edge of the one or more openings of the first carrier body.

19. The method of claim 17, wherein areas of the second carrier body mask portions of the work area on the first side of the substrate during the processing.

20. The method of claim 19, wherein the second carrier body comprises one or more openings, the one or more openings formed as proximity masks to form structures on the second side of the substrate and further comprising flipping the carrier proximity mask to process the second side of the substrate through the one or more openings of the second carrier body.

* * * * *